(12) United States Patent
Fujii et al.

(10) Patent No.: US 7,039,542 B2
(45) Date of Patent: May 2, 2006

(54) METHOD OF MEASURING MOTOR CONSTANT FOR INDUCTION MOTOR

(75) Inventors: Shuichi Fujii, Fukuoka (JP); Hideaki Iura, Fukuoka (JP); Kozo Ide, Fukuoka (JP); Yoshiaki Yukihira, Fukuoka (JP)

(73) Assignee: Kabushiki Kaisha Yasukawa Denki, Fukuoka (JP)

( * ) Notice: Subject to any disclaimer, the term of this patent is extended or adjusted under 35 U.S.C. 154(b) by 173 days.

(21) Appl. No.: 10/341,091

(22) PCT Filed: Jul. 5, 2001

(86) PCT No.: PCT/JP01/05844

§ 371 (c)(1),
(2), (4) Date: Jan. 10, 2003

(87) PCT Pub. No.: WO02/06843

PCT Pub. Date: Jan. 24, 2002

(65) Prior Publication Data
US 2004/0138837 A1    Jul. 15, 2004

(30) Foreign Application Priority Data
Jul. 13, 2000    (JP)    ............................ 2000-212896

(51) Int. Cl.
*H02P 21/00* (2006.01)
(52) U.S. Cl. ........................... 702/115; 702/64; 318/727
(58) Field of Classification Search ................. 702/64, 702/115, 57, 65, 72, 74, 124–126, 176–178, 702/182, 183, 189, 190, 197, 198; 318/799, 318/804, 809, 808, 727, 811, 805; 187/391, 187/393; 700/41, 42, 52, 296, 287; 324/772, 324/177; 388/906, 907.5, 909
See application file for complete search history.

(56) References Cited

U.S. PATENT DOCUMENTS 6,242,885 B1 *    6/2001    Ide et al. ..................... 318/811

(Continued)

FOREIGN PATENT DOCUMENTS

JP    62-042074    2/1987

(Continued)

OTHER PUBLICATIONS

Khambadkone et al., "Compensated synchronous PI current controller in overmodulation range and six-step operation of (Continued)

*Primary Examiner*—Hal Wachsman
(74) *Attorney, Agent, or Firm*—Knobbe, Martens, Olson & Bear, LLP

(57) ABSTRACT

A method of measuring a motor constant is provided in a vector control apparatus for an induction motor. A voltage output phase θv is set at a previously set arbitrary phase. Prior to applying a current, a current command is fed to operate the vector control apparatus with a proportional-plus-integral controller being set operative. After conduction for a predetermined time, the gain of the proportional-plus-integral controller is set to zero to maintain an integrated value constant and accordingly fix a voltage command value. In this state, a current command value and a detected current value are measured. This measurement is performed at two levels of current, and a primary resistance value (or a line-to-line resistance value) is derived from the slope.

9 Claims, 12 Drawing Sheets

U.S. PATENT DOCUMENTS 6,281,659 B1 * 8/2001 Giuseppe .................... 318/799

FOREIGN PATENT DOCUMENTS

| JP | 7-55899 | 3/1995 |
| JP | 2000-312497 | 11/2000 |
| JP | 2001-194433 | 7/2001 |

OTHER PUBLICATIONS space-vector-modulation-based vector-controlled drives", Jun. 2002,IEEE Transactions on Industrial Electronics, vol. 49, 3, pp. 574-580.*

JEC-37 ( Prior Art Example 1), no translation.

* cited by examiner

A: current control - first set time
B: shutdown of current control (vd=constant)
    - second set time A: current control
B: shutdown of current control v_ofs15 = (v_ref_ave1 - v_ref_ave3)
/ (i_ref_ave1 - i_ref_ave3)
* (-i_fb_ave3) + v_ref_ave3
Zx1 = {v_ref_ave1 - v_ofs15) / √3}
/ i_fb_ave1
Zx1: impedance at 15Hz v_ofs30 = (v_ref_ave2 - v_ref_ave4)
/ (i_ref_ave2 - i_ref_ave4)
* (-i_fb_ave4) + v_ref_ave4
Zx2 = {v_ref_ave2 - v_ofs30) / √3}
/ i_fb_ave2
Zx2: impedance at 30Hz

METHOD OF MEASURING MOTOR CONSTANT FOR INDUCTION MOTOR

This application is the U.S. National Phase under 35 U.S.C. §371 of International Application PCT/JP01/05844, filed Jul. 5, 2001, which claims priority to Japanese Patent Application No. 2000-212896, filed Jul. 13, 2000. The International Application was published under PCT Article 21(2) in a language other than English.

TECHNICAL FIELD

The present invention relates to a method of measuring a motor constant for an induction motor.

BACKGROUND ART

There is software for controlling an inverter, which includes a method of determining a motor constant by conducting a winding resistance measurement, a lock test and a no-load test, as shown in JEC-37 (Prior Art Example 1). Also, JP-A-7-55899 discloses a method of tuning a constant of an induction motor while the induction motor remains inoperative (Prior Art Example 2). In this method, a single-phase AC current is supplied to an induction motor, and a detected d-axis current value or a detected q-axis current value is expanded in Fourier series to determine a constant of the induction motor. Here, d-q axis coordinates are rotating coordinates which rotate at the same velocity as a rotating magnetic field of the motor.

The method shown in Prior Art Example 1 is not suitable for automatic measurements by means of driving an inverter because it involves operations for fixing a rotor of an induction motor and releasing the fixation between a lock test and a no-load current test.

Also, in the no-load current test, the induction motor must be operated alone, so that if a load has been coupled thereto, an operation is required for once disconnecting the load to leave the motor alone, thus incurring a problem of a low efficiency.

Prior Art Example 2 needs complicated software because a single-phase AC current is applied and Fourier series expansion is utilized for the determination of a motor constant, thus requiring a long software processing time, and a large memory capacity for the software.

DISCLOSURE OF THE INVENTION

It is therefore an object of the present invention to provide a method of measuring a motor constant for an induction motor which comprises accurately tuning the constant of the induction motor even when a load is coupled to the induction motor, and involves only simple processing therefor.

The present invention is directed to a motor vector control apparatus for a motor which separates a motor primary current into a flux component (d-axis component) and a torque component (q-axis component), and has a d-axis current proportional-plus-integral controller which receives a current command for a d-axis component and a detected current value of the d-axis component for controlling a deviation between both to reduce to zero; a first adder for adding an output of this proportional-plus-integration controller and an arbitrary d-axis auxiliary voltage command value to derive a d-axis voltage command value; a q-axis current proportional-plus-integral controller which receives a current command for a q-axis component and a detected current value of the q-axis component for controlling a deviation between both to reduce to zero; a second adder for adding an output of this proportional-plus-integral controller and an arbitrary q-axis auxiliary voltage command value to derive a q-axis voltage command value; and a power converter for calculating a magnitude v_ref and a voltage phase θv of a voltage command from the d-axis voltage command value and the q-axis voltage command value, and converting a DC current to a three-phase AC current based on the magnitude of the voltage command and the phase of the voltage command to provide the three-phase AC current. The vector control apparatus is configured to convert the motor to an equivalent circuit of a three-phase Y (star) connection to handle and control the motor.

The vector control apparatus is operated by applying the same with a d-axis current command value id_ref1 and a q-axis current command value iq_ref1 previously set at arbitrary fixed values as first command values, and with the d-axis auxiliary voltage command vd_ref_c and the q-axis auxiliary voltage command value vq_ref_c both set at zero. After the lapse of a previously set first time, a proportional gain of the d-axis proportional-plus-integral controller and a proportional gain of the q-axis proportional-plus-integral controller are set to zero. After the lapse of a previously set second time from this time, the voltage command:

$$v\_ref = \sqrt{(vd\_ref^2 + vq\_ref^2)}$$

is created from the d-axis voltage command vd_ref and the q-axis voltage command vq_ref, and the detected current value:

$$i\_fd = \sqrt{(id\_fd^2 + iq\_fb^2)}$$

is created from the d-axis detected current value id_fb and the q-axis detected current value iq_fb. An average of v_ref and an average of i_fb recorded within an arbitrary time during the second time are set as first data v_ref1, i_fb1, respectively.

Next, the vector control apparatus is operated, after the gains of both proportional-plus-integral controllers are returned to original values, by applying a d-axis current command value id_ref2 and a q-axis current command value iq_ref2 previously set at arbitrary fixed values as second command values, and applying the d-axis auxiliary voltage command value vd_ref_c and the q-axis auxiliary voltage command value vq_ref_c set at zero. After the lapse of the previously set first time, the proportional gain of the d-axis current proportional-plus-integral controller and the proportional gain of the q-axis current proportional-plus-integral controller are set to zero. After the lapse of a previously set second time from this time, a primary resistance of the motor is calculated in accordance with:

$$R1 = \{v\_ref2 - v\_ref1\}/\sqrt{3}\}/(i\_fb2 - i\_fb1)$$

using an average of v_ref and an average of i_fb recorded within an arbitrary time during the second time as second data v_ref2, i_fb2, respectively, and a line-to-line resistance of the motor is calculated in accordance with $R_{L-L} = 2 \cdot R1$.

Alternatively, the gains and outputs of the proportional-plus-integral controllers, the d-axis auxiliary voltage command and the q-axis auxiliary voltage command are set to zero, a previously set arbitrary fixed value is set to a voltage phase θv, and a magnitude vref of the voltage command is given by $v\_ref = vamp \cdot \sin(2 \cdot \pi \cdot fh \cdot t)$, where fh is a proper frequency 1/10 or more as high as a rated operation frequency of the motor, and vamp is a voltage amplitude. Vamp is incrementally or decrementally adjusted while monitoring the current value i_fb such that:

$$i\_fb = \sqrt{(id\_fb^2 + iq\_fb^2)}$$

calculated from a d-axis detected current value id_fb and a q-axis detected current value iq_fb reaches a first set current value. After i_fb reaches the first set current value, an average of an absolute value of the magnitude v_ref of the voltage command is set to v_ref_ave1; an average of an absolute value of the magnitude of the detected current value i_fb to i_fb_ave1, and the phase of i_fb with respect to v_ref to θdif1 after the lapse of an arbitrarily set time.

Next, vamp is adjusted to reach a previously set second set current value, and after the lapse of the set time, the average of the absolute value of the magnitude v_ref of the current command is set to v_ref_ave2; the average of the absolute value of the magnitude of the detected current value i_fb to i_fb_ave2; and the phase of i_fb with respect to v_ref to θdif2 for calculating:

$Zx = \{(v\_ref\_ave2 - v\_ref\_ave1)/\sqrt{3}\}/(i\_fb\_ave2 - i\_fb\_ave1), \theta dif\_L = (\theta dif1 + \theta dif2)/2$ $Zx\_r = Zx \cdot \cos\theta dif\_L, Zx\_i = Zx \cdot \sin\theta dif\_L$ From these, a secondary resistance of the motor is calculated in accordance with R2=Zx_r−R1, and a leakage inductance in accordance with L=Zx_i/(2·π·fh).

Alternatively, the gains and outputs of the proportional-plus-integral controllers, the d-axis auxiliary voltage command and the q-axis auxiliary voltage command are set to zero, and a previously set arbitrary fixed value is set to a voltage phase θv. A magnitude vref of the voltage command is given by v_ref=vamp·sin(2·π·f1·t), where f1 is a proper frequency ⅕ or less as high as the rated operation frequency of the motor, and vamp is a voltage amplitude. Vamp is incrementally or decrementally adjusted while monitoring the current value i_fb such that:

$$i\_fb = \sqrt{(id\_fb^2 + iq\_fb^2)}$$

calculated from a d-axis detected current value id_fb and a q-axis detected current value iq_fb reaches a previously arbitrarily set first set current value. After i_fb reaches the first set current value, an average of an absolute value of the magnitude v_ref of the voltage command is set to v_ref_ave3; an average of an absolute value of the magnitude of the detected current value i_fb to i_fb_ave3; and the phase of i_fb with respect to v_ref to θdif3 after the lapse of a first arbitrary set time.

Next, vamp is adjusted to reach a previously set second set current value, and after the lapse of a second arbitrary set time, the average of the absolute value of the magnitude v_ref of the current command is set to v_ref_ave4; the average of the absolute value of the magnitude of the detected current value i_fb to i_fb_ave4; and the phase of i_fb with respect to v_ref to θdif4 for calculating:

$Zx2 = \{v\_ref\_ave4 - v\_ref\_ave3)/\sqrt{3}\}/(i\_fb\_ave4 - i\_fb\_ave3), \theta dif\_m = (\theta dif3 + \theta dify4)/2$ From these, a mutual inductance of the motor is calculated in accordance with:

$$M = \frac{R2}{2\cdot\pi\cdot f1} \cdot \sqrt{\frac{Zx\_r2 - R1}{R1 + R2 - Zx\_r2}}$$

The present invention is also directed to an induction motor in a motor control apparatus which is configured to supply a three-phase AC current to the induction motor through an inverter to operate the motor at a variable velocity, and has a current detector for detecting the current flowing at two arbitrary phases or three phases of an inverter output; a proportional-plus-integral controller which receives a current command value for a primary current fed to the motor, and a primary current value i_fb of a primary current detector derived from a current value detected by the current detector to control an output voltage command value v_ref such that a deviation between both reduces to zero, and a power converter for providing a three-phase AC current based on the voltage command value v_ref and a voltage output phase θv. The motor control apparatus is configured to convert the motor to an equivalent circuit of a three-phase Y (star) connection to handle the equivalent circuit.

The voltage output phase θv is chosen at a previously set arbitrary phase. Prior to applying a current, a current command is fed to operate the vector control apparatus with a proportional-plus-integral controller being set operative. After conduction for a predetermined time, a current command value and a detected current value are measured, k is measured at two levels of current, and a primary resistance value (or a line-to-line resistance value) is derived from the slope of the current at that time with the gain of the current controller being set to zero to maintain an integrated value constant and accordingly fix a voltage command value.

Also, the voltage phase θv is chosen at a previously set arbitrary value, and the magnitude vref of the voltage command is fed in sinusoidal wave. An average of the voltage command value and an average of the detected current value, as well as a difference in phase between the voltage command value and detected current value are calculated respectively at two frequencies. An impedance is determined from the voltage command value and detected current value, and the impedance is decomposed into a real component and an imaginary component by the phase difference. (Primary resistance value+Secondary resistance value) is calculated from the real component, while the impedance due to a leakage inductance is calculated from the imaginary component. From these, the second resistance value and leakage inductance are found.

The present invention is directed to a motor control apparatus which separates a primary current of a motor separated into a flux component (d-axis component) and a torque component (q-axis component) for a no-load current value, and has a d-axis current proportional-plus-integral controller which receives a current command of the d-axis component and a detected current value of the d-axis component for controlling a deviation between both to reduce to zero, wherein the output of the proportional-plus-integral controller is set to a d-axis voltage command value;

a q-axis current proportional-plus-integral controller which receives a current command of the q-axis component and a detected current value of the q-axis component for controlling a deviation between both to reduce to zero, wherein the output of the proportional-plus-integral controller is set to a q-axis voltage command value; and a power converter for calculating a magnitude v_ref and a voltage phase θv of a voltage command from the d-axis voltage command value which is an output of the d-axis current proportional-plus-integral controller and the q-axis voltage command value which is an output of the q-axis current proportional-plus-integral controller, and converting a DC current to a three-phase AC current based on the magnitude of the voltage command and the phase of the voltage command to provide the three-phase AC current, wherein the motor control apparatus is configured to control the d-axis current command and the q-axis current command to operate the motor in conformity with an arbitrary velocity command.

In a normal operating condition, an output frequency fphi, the d-axis voltage command vd_ref, the q-axis voltage command vq_ref, a d-axis detected current value id_fb, and a q-axis detected current value iq_fb are measured. Both or one of a mutual inductance M and a no-load current I0 of the motor is determined using a previously set base voltage v_base and base frequency f_base of the motor, a primary resistance value R1, and a leakage inductance L.

The present invention is also directed to a motor control apparatus configured to supply a three-phase AC current to the induction motor through an inverter to operate the motor at a variable velocity, which has a power converter for providing the three-phase AC current based on an output voltage command value v_ref and a voltage output phase θv, and a current detector for detecting a primary current flowing into the induction motor, wherein a detected primary current value i1 derived from a current value detected by the current detector is fed to the motor control apparatus.

An equivalent circuit per phase of the induction motor is created in the form of T-1 type equivalent circuit.

The voltage phase θv is set to a previously set arbitrary fixed value, and a predetermined fixed value to the voltage command value v_ref. The detected primary current value i1 flowing into the induction motor at this time is read, and a current im flowing through a mutual inductance M is estimated in accordance with:

$$\hat{im} = \left(1 + \frac{R1}{R2}\right) \cdot i1 - \frac{v\_ref}{R2}$$

using the primary current value i1 and a primary resistance value R1 and a secondary resistance value R2 given by a separate means. A time constant $\hat{\tau}_{im}$ is determined from the waveform of the estimate îm of the rising current, and the mutual inductance M is calculated in accordance with:

$$M = \frac{R1 \cdot R2}{R1 + R2} \cdot \hat{\tau}_{im}$$

The no-load current I0 is calculated as required, using the mutual inductance M or the time constant $\hat{\tau}_{im}$, the primary resistance value R1, a leakage inductance L and the secondary resistance value R2 given by a separate means, and a rated voltage Vrate and a rated frequency frate given as the rating of the motor, and the mutual inductance M.

Alternatively, a current im flowing through the mutual inductance M is estimated using the primary current value i1, and a primary resistance value R1 and a secondary resistance value R2 given by a separate means in accordance with:

$$\hat{im} = i1 - \frac{R1}{R2}(i1_{co} - i1)$$

without using a voltage value, where i1 represents a constant value to which the primary current value i1 converges when the voltage command v_ref is applied.

According to the present invention it is possible to accurately tune the primary resistance and secondary resistance, a leakage inductance and a mutual inductance or a no load current, which are required for accurately controlling an induction motor, even when a load is coupled to the induction motor.

BEST MODE FOR CARRYING OUT THE INVENTION

Figure 1:
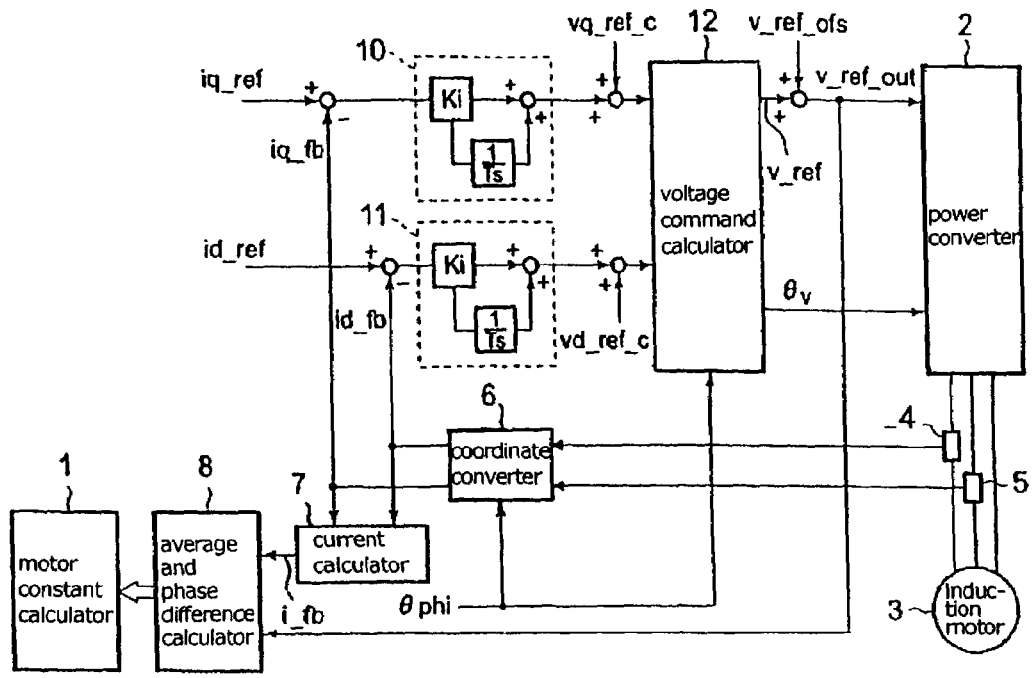
FIG. 1 is a block diagram of an induction motor control apparatus according to one embodiment of the present invention.

FIG. 1 is a block diagram illustrating the configuration of one embodiment of an induction motor control apparatus in the present invention. Proportional-plus-integral controller 10 performs a control such that a deviation between q-axis current command iq_ref and detected q_axis current value iq_fb becomes zero, and q-axis auxiliary voltage command vq_ref_c is added to the output of proportional-plus-integral controller 10 to create q-axis voltage command vq_ref. Similarly, proportional-plus-integral controller 11 performs a control such that a deviation between d-axis current command id_ref and detected d-axis current value id_fb becomes zero, and d-axis auxiliary voltage command vd_ref_c is added to the output of proportion integration controller 11 to create d-axis voltage command vd_ref. A proportional gain of a proportional integrator is represented by Ki, and an integral gain by (1/T). Voltage command processor 12 calculates magnitude v_ref and voltage phase θv of a voltage command from vq_ref and vd_ref, and also adds phase θphi of magnetic flux to θv to calculate a voltage phase on three-phase AC coordinates. Also, voltage command offset value v_ref_ofs is added to the magnitude v_ref of the voltage command. Here, iq_ref, id_ref and fphi are given by separately provided calculation circuits during a normal operating condition of an induction motor. Power converter 2 serves to supply induction motor 3 with a three-phase AC voltage based on the above-mentioned v_ref+v_ref_ofs and θref. Currents flowing into induction motor 3 are detected by current detectors 4 and 5, and fed to coordinate converter 6 where they are converted to iq_fb and id_fb on d_q coordinates. iq_fb and id_fb are converted to magnitude i_fb of their composite vector by current processor 7. Average and phase difference calculator 8 is a calculator for calculating averages of the voltage command and detected current value as well as a phase difference between the voltage command and detected current value, which are required for calculating a motor constant of induction motor 3, from v_ref+v_ref_ofs and i_fb. Motor constant processor 1 is a calculator for calculating the motor constant of induction motor 3 based on signals calculated by average and phase difference calculator 8.

Figure 2:
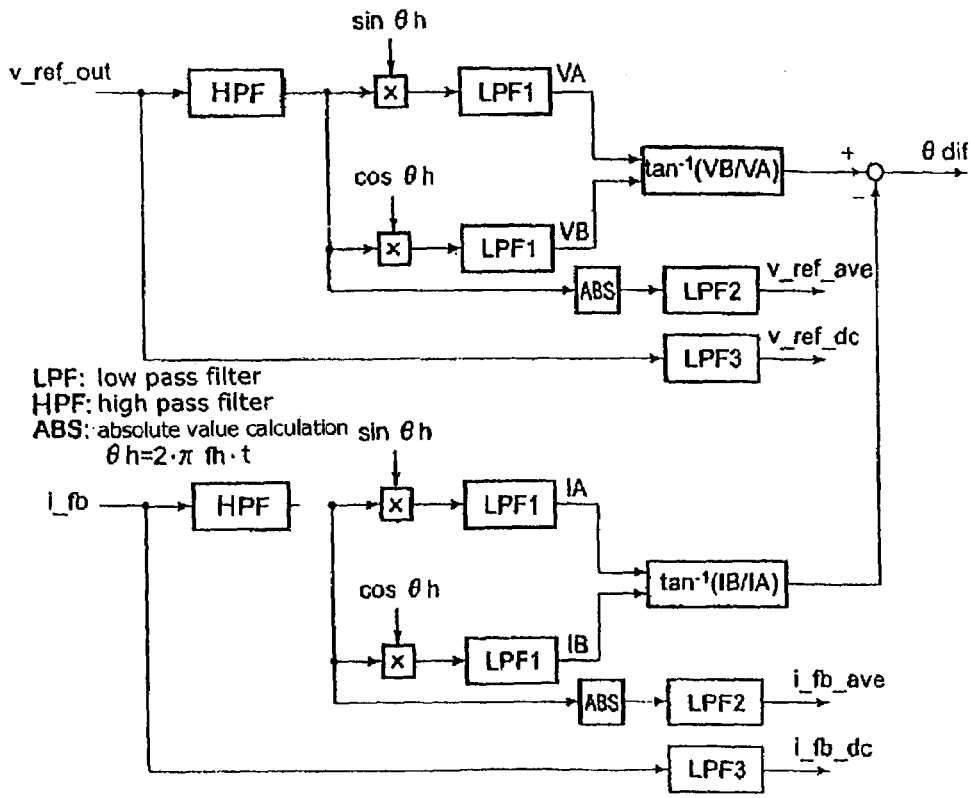
FIG. 2 is a configuration diagram of average/phase difference calculator 8.

FIG. 2 illustrates the specific configuration of average and phase difference calculator 8, that calculates, from v_ref_out and i_fb, a phase difference between them, averages of absolute values of respective frequency components, and DC components. Here, the average is derived through a low pass filter (LPF), but may be calculated in accordance with a method based on moving average or the like.

Figure 3:
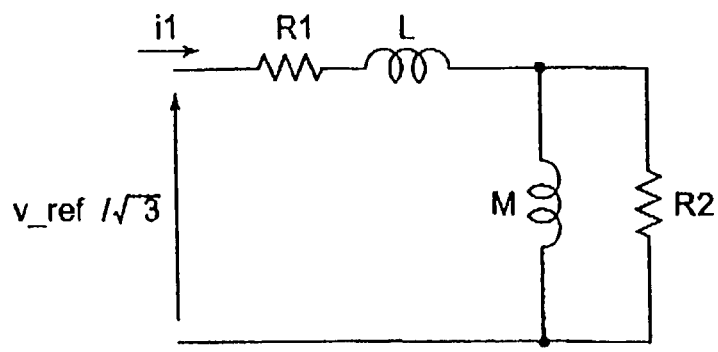
FIG. 3 is a T-1 type equivalent circuit diagram of an induction motor.

FIG. 3 illustrates a T-1 type equivalent circuit of an induction motor which is used for determining a motor constant of the induction motor in this embodiment. FIG. 3 is an equivalent circuit for each phase, and is applied with a voltage expressed by:

$$v\_ref/\sqrt{3}$$

I1 is a primary current of the motor; R1 is a primary resistance of the motor; R2 is a secondary resistance of the motor; l is a leakage inductance of the motor; and M is a mutual inductance of the motor.

A first embodiment will be described.

Figure 4:
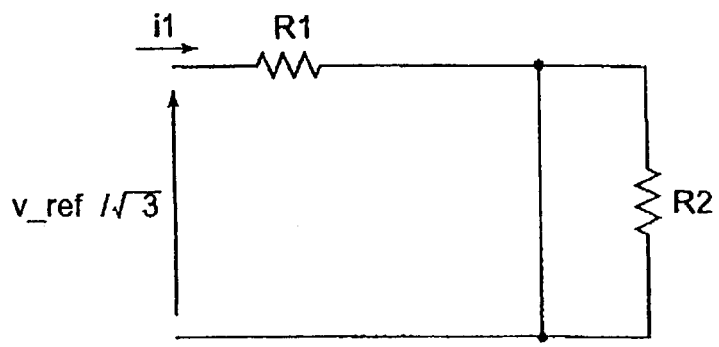
FIG. 4 is an equivalent circuit diagram during primary resistance tuning.

When a DC current is applied to induction motor 3, impedance ωM at mutual inductance M is zero, so that the equivalent circuit in FIG. 3 is changed as illustrated in FIG. 4. Therefore, primary resistance R1 is calculated in accordance with:

$$R1=(v\_ref/\sqrt{3})/I1$$

Figure 5:
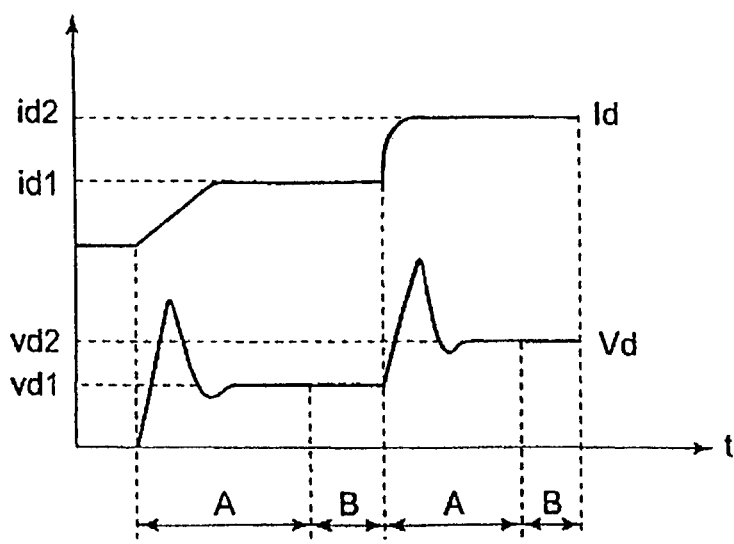
FIG. 5 is a time chart of a voltage command value and a detected current value during the primary resistance tuning.
Figure 6:
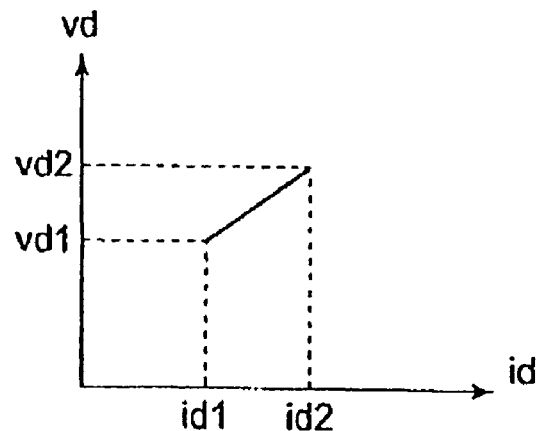
FIG. 6 is a graph of the voltage command value and detected current value during the primary resistance tuning.

When setting as a line-to-line resistance, RL-L=2·R1 is handled as the line-to-line resistance. As tuning is started for the primary resistance, iq_ref and id_ref are applied as primary current command values arbitrarily set as a current command. As the current command is given, a voltage command is generated in accordance with the gain of proportional-plus-integral controllers 10, 11, and a three-phase AC voltage is delivered from power converter 2 and applied to motor 3 through which current I1 flows. Current I1 is detected by current detectors 4, 5, subjected to coordinate conversion and current processing, and resulting i_fb is applied to motor constant processor 1. A time required for the current to rise is determined by the gain of proportional-plus-integral controllers 10, 11, so that this time is set as a previously set arbitrary time, and the proportional gain of the q-axis and d-axis proportional-plus-integral controllers is set to zero after the lapse of the set time. Since this causes zero to be fed to the integrator, the output of the proportional controller is fixed to an output value immediately before the proportional gain is set to zero, thereby stably maintaining the voltage command at a fixed value. Waiting a constant time in this state, averages are measured for voltage command v_ref and detected current value i_fb during the time, and are set to v_ref1 and i_fb1, respectively. Next, the proportional gain of proportional-plus-integral controllers 10, 11 is returned to an original value, and current command values iq_ref ad id_ref are used as second set current values, and are manipulated in a similar manner. Averages of the voltage command values and current command values at this time are set to v_ref2, i_fb2, respectively. A change over time in voltage command v_ref and detected current value i_fb in this event are shown in FIG. 5. The relationship between v_ref1, i_fb1, v_ref2, i_fb2 is established as shown in FIG. 6, wherein primary resistance value R1 is determined from the slope of this linear line. Considering that v_ref is a line-to-line value, R1 is given by:

$$R1=\{(v\_ref2-v\_ref1)/\sqrt{3}\}/(i\_fb2-i\_fb1)$$

A second embodiment will be described.

The present embodiment is a modification of the first embodiment described above, wherein when proportional gain Ki of proportional-plus-integral controllers 10, 11 is set to zero, the q-axis and d-axis voltage commands at that time are substituted into auxiliary voltage command values vq_ref_c and vd_ref_c, respectively, and simultaneously, proportional gain Ki and integral gain (1/T) of proportional-plus-integral controllers 10, 11, and the outputs of proportional-plus-integral controllers 10, 11 are set to zero, such that a resulting voltage command is applied. The remaining processing is the same as the first embodiment.

A third embodiment will be described.

While the current level is measured at two points in the first and second embodiments described above, the measurements are made at three points or more for improving the measurement accuracy in this embodiment. Describing for measurements at three points, when measurements are made at points 1, 2, 3, R1 is calculated in intervals between points 1 and 2, between points 2 and 3, and between points 1 and 3, respectively, or in arbitrary two of these intervals, as is the case in the first and second embodiments, and an average of calculated values is employed as R1 which should be determined. For measurements at four points or more, R1 may be similarly calculated in arbitrary intervals, such that an average of calculated values is used.

A fourth embodiment will be described.

Figure 7:
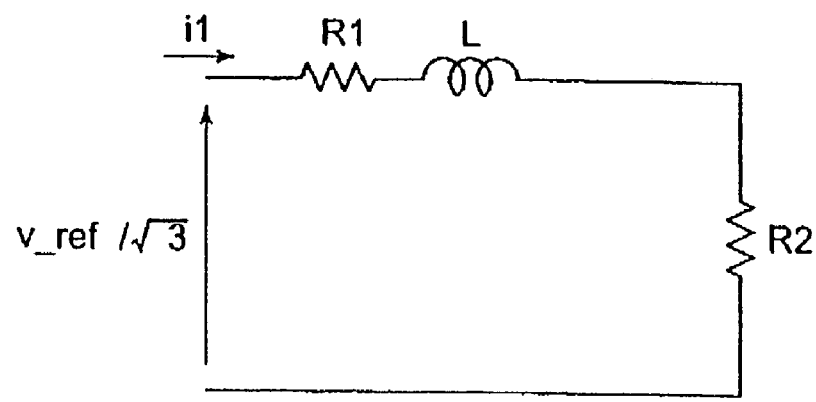
FIG. 7 is an equivalent circuit diagram during secondary resistance and leakage inductance tuning.
Figure 8:
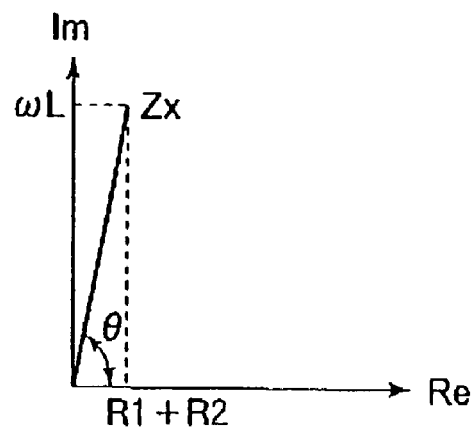
FIG. 8 is a vector diagram of an impedance in the equivalent circuit during the secondary resistance and leakage inductance tuning.

The voltage command is given as v_ref=vamp·sin (2·π·fh·t), and θref as an arbitrary fixed value. Vamp is initially set to zero, and fh is set to a value equal to or higher than the rated operation frequency of the motor. When the frequency is high, an equivalent circuit becomes as illustrated in FIG. 7 on the assumption that a current hardly flows into M because ωM>>R2 stands in the equivalent circuit illustrated in FIG. 3. When the phase difference between the voltage and current at this time is represented by θdif, the relationship between (R1+R2) and ω1 is established as shown in FIG. 8, represented by (R1+R2)=|Zx|·cos θdif, and ω1=|Zx|·sin θdif, where |Zx| indicates the impedance of the circuit. Thus, R2 and L can be derived using previously determined R1.

Figure 9:
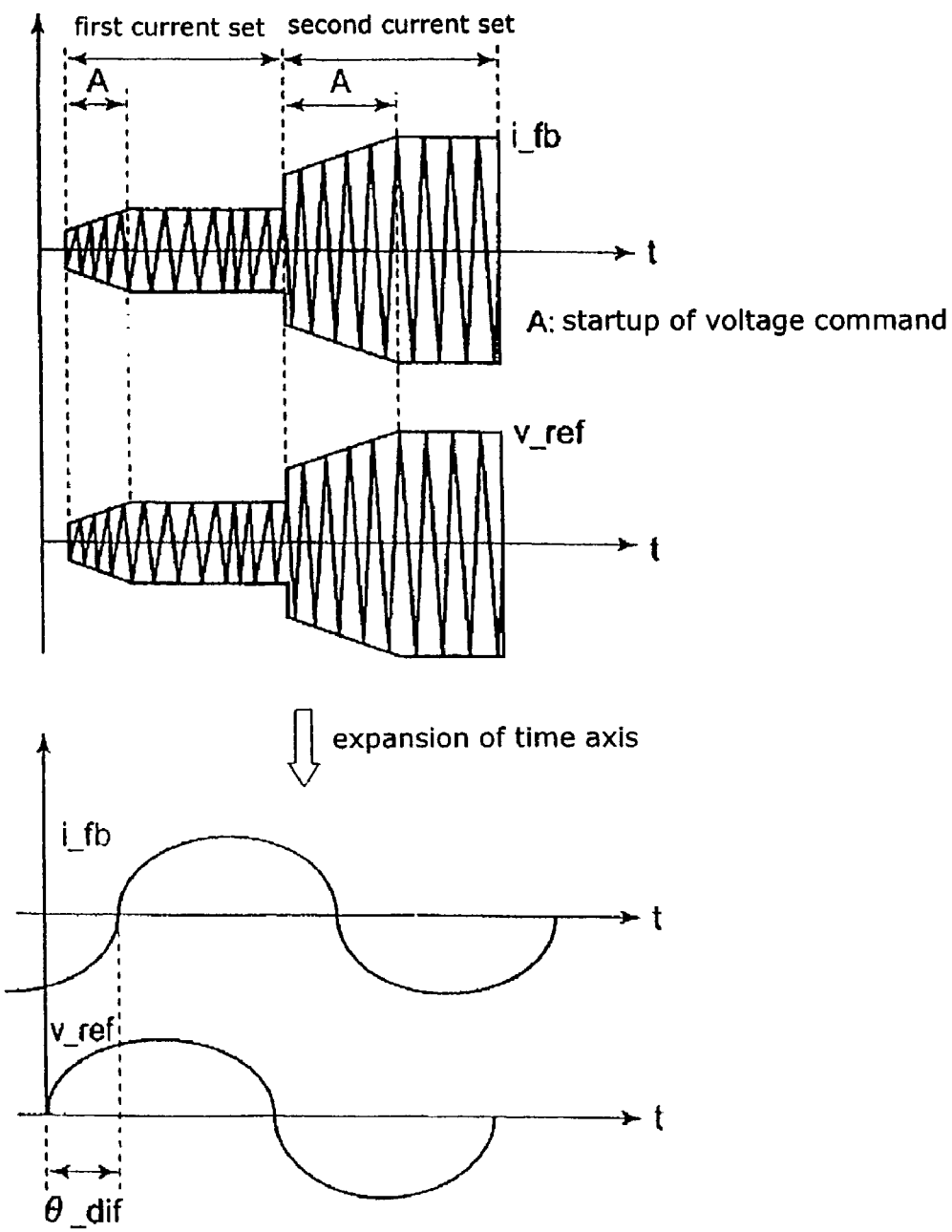
FIG. 9 is a time chart of a voltage command value and a detected current value during the secondary resistance and leakage inductance tuning.

For determining |Zx|, v_ref shown above is applied, and vamp is gradually increased until average i_fb_ave of the absolute value of the detected current value reaches a previously set first set current value. When i_fb_ave matches the set value, average v_ref_ave of the absolute value of a frequency component of v_ref, average i_fb_ave of the absolute value of the detected current value, and phase difference θdif are stored in a memory as v_ref_ave1, i_fb_ave1, θdif1, respectively, after waiting for a certain time until the output of the filter becomes stable. Next, vamp is adjusted such that average i_fb_ave reaches a previously set second set current value, and the value is similarly read when i_fb_ave matches the second set current value. Then, average v_ref_ave, average i_fb_ave and phase difference θdif are stored as v_ref_ave2, i_fb_ave2, θdif2, respectively. FIG. 9 shows a change over time in the voltage command and detected current value in this case. Impedance |Zx| of the circuit is calculated in accordance with:

|Zx|={(v_ref_ave2−v_ref_ave1)/
√3}/(i_fb_ave2−i_fb_ave1)

as the slope of the voltage and current, as in the case of R1.

The phase difference is calculated in accordance with θdif_L=(θdif1+θdif2)/2.

From this equation and the aforementioned equation, secondary resistance R2 and leakage inductance L are calculated in accordance with:

R2={(v_ref_ave2−v_ref_ave1)/
√3}/(i_fb_ave2−i_fb_ave1)·cos θdif_L−R1,

L=[{(v_ref_ave2−v_ref_ave1)/
√3}/(i_fb_ave2−i_fb_ave1)·sin θdif_L]/(2·π·fh)

While the explanation has been made with the initial value for vamp being zero, the value of a flowing current can be predicted with reference to a V/f pattern, so that a reduction in time can be made by previously setting some value and increasing or decreasing from this value.

A fifth embodiment will be described.

The present embodiment is a modification of the fourth embodiment, wherein v_ref_ofs is added to voltage command v_ref as an offset value, and the resulting value is used as a voltage command. As illustrated in FIG. 2, data v_ref_ave, i_fb_ave, θdif for use in calculating R1+R2 and L can be handled in a similar manner to the fourth embodiment by using data from which a DC component is removed by passing an input signal through a high pass filter.

A sixth embodiment of the invention will be described.

The present embodiment is a modification of the fourth embodiment, wherein v_ref_ofs is added to voltage command v_ref as an offset value, and the resulting value is used as a voltage command. Since the voltage equivalent to the offset value is provided as a DC component, an equivalent circuit therefor is that illustrated in FIG. 4, so that primary resistance R1 is determined by calculating the ratio of a DC component of this voltage command value to a DC component of the detected current value. To extract a DC component of a signal, the signal may be averaged. In the embodiment, a low pass filter [LPF3] is used for detection as illustrated in FIG. 2. The value of v_ref_ofs is determined herein by adjusting v_ref_ofs, while comparing the detected current value with the set current value in a manner similar to the fourth embodiment, before an AC signal is applied.

The sixth embodiment is the same as the fourth embodiment except that R1 thus determined is used for calculating R2. In this way, since R1, R2, L can be determined in a single step, the execution time can be reduced.

A seventh embodiment of the invention will be described.

In the fourth embodiment, frequency f1 is set at a very low frequency with respect to the rated operation frequency of the motor. In this event, since a current flowing into M cannot be ignored, the equivalent circuit illustrated in FIG. 3 is based on the following discussion.

The equivalent circuit is expressed by the equation:

$$\left(R1 + j\omega L + \frac{j\omega MR2}{R2 + j\omega M}\right)I1 = \text{v\_ref}/\sqrt{3}, \omega = 2\cdot\pi\cdot fh$$

This equation is solved to derive:

$$\frac{R1R2^2 + \omega^2M^2R1 + \omega^2M^2R2}{R2^2 + \omega^2M^2} + j\frac{\omega LR2^2 + \omega^3LM^{2'} + \omega MR2}{R2^2 + \omega^2M^2} =$$

$$\frac{\text{v\_ref}/\sqrt{3}}{I1} = Zr + jZi$$

where:

$$Zr = \frac{\text{v\_ref}/\sqrt{3}}{I1}\cdot\cos\theta m,$$

$$Zi = \frac{\text{v\_ref}/\sqrt{3}}{I1}\cdot\sin\theta m,$$

$$\theta m = \tan^{-1}\left(\frac{\omega LR2^2 + \omega^3LM^2 + \omega MR2}{R1R2^2 + \omega^2M^2R1 + \omega^2M^2R2}\right)$$

M is calculated by comparing real parts:

$$M = \frac{R2}{\omega}\cdot\sqrt{\frac{Zr - R1}{R1 + R2 - Zr}}$$

Thus, M is derived.

Here, when M is calculated in a similar manner to the fourth embodiment except that fh is set at a low frequency, and the impedance is represented by |Zx2| and the phase difference by θdif_m, Zx_r2=|Zx2|·cos θdif_m From this and previously determined R1, R2, mutual inductance M is calculated in accordance with:

$$M = \frac{R2}{2\cdot\pi\cdot f1} \cdot \sqrt{\frac{Zx\_r2 - R1}{R1 + R2 - Zx\_r2}}$$

Eighth and ninth embodiments will be described.

In the present embodiment, similar to those shown in the fifth and sixth embodiments, v_ref_ofs is added to voltage command v_ref as an offset. Details on the processing are the same as those shown in the fifth and sixth embodiments. Since the frequency is low in the seventh embodiment, the motor can be prevented from unnecessarily moving by applying a DC offset, as shown in this method.

A tenth embodiment will be described.

Figure 10:
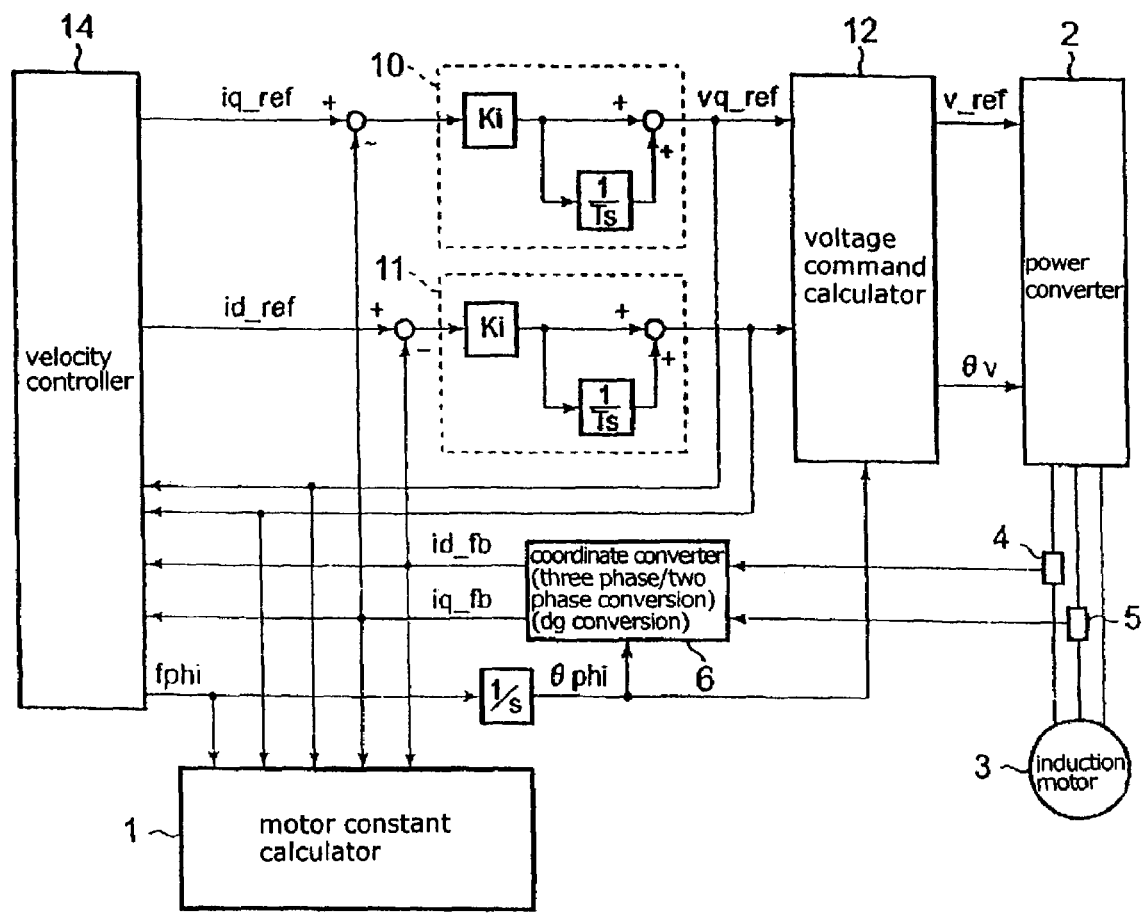
FIG. 10 is a block diagram when a tenth embodiment is applied.

FIG. 10 illustrates a block diagram in which a tenth embodiment of the invention is implemented. From a configuration for conducting a normal vector control, q-axis voltage command value vq_ref, d-axis voltage command value vd_ref, q-axis detected current value iq_fb, d-axis detected current value id_fb and output frequency value fphi are extracted and fed to motor constant culculator 1 to calculate mutual inductance M and no-load current value I0. Velocity controller 14 calculates q-axis current command value iq_ref, d-axis current command value id_ref and output frequency value fphi based on a velocity command in accordance with a generally used vector control scheme. Velocity controller 14 is simplified for description since it does not relate to the features of the present invention. Coordinate converter 6 is a coordinate converter for converting a detected phase current value to a value in a dq-coordinate system. q-axis PI current controller 10 and d-axis PI current controller 11 are controllers for controlling the current command value to match the detected current value. Voltage command calculator 12 calculates magnitude v_ref and voltage phase θv of a three-phase AC voltage from the q-axis voltage command, d-axis voltage command value, and magnetic flux phase θphi. Magnetic flux phase θphi is calculated by integrating output frequency fphi. Power converter 2 supplies three-phase AC power to induction motor 3 based on v_ref and θv.

Here, after an operation command is fed, output frequency fphi, d-axis voltage command vd_ref, q-axis voltage command vq_ref, d-axis detected current value id_fb, and q-axis detected current value iq_fb are read after the lapse of one second from the time an acceleration of induction motor 3 is completed, and the following equations:

$$Vqq = \frac{vq\_ref}{\sqrt{3}} - R1\cdot iq\_fb - 2\pi\cdot fphi\cdot L\cdot id\_fb$$

$$Vqq = \frac{vd\_ref}{\sqrt{3}} - R1\cdot id\_fb - 2\pi\cdot fphi\cdot L\cdot iq\_fb$$

$$Q = Vqq\cdot id\_fb - Vqq\cdot iq\_Fb$$

$$E = \sqrt{Vqq^2 + Vdd^2}$$

$$M = \frac{E^2}{2\pi\cdot fphi\cdot Q}$$

$$I0 = \frac{v\_base/\sqrt{3}}{2\pi\cdot f\_base(M+L)}$$

are calculated using previously set base voltage v_base and base frequency f_base of the motor, and separately calculated primary resistance value R1 and leakage inductance L to determine mutual inductance M and no-load current I0 of the motor.

While it is assumed the measurements are made upon completion of the acceleration, the measurement may be made at any arbitrary time during operation.

The method according to the present invention extracts signals from the respective components for calculations in a normal operating condition, and can therefore be applied irrespective of a difference in configuration of the velocity controller due to the presence or absence of PG (Pulse Generator) and the like.

Figure 11:
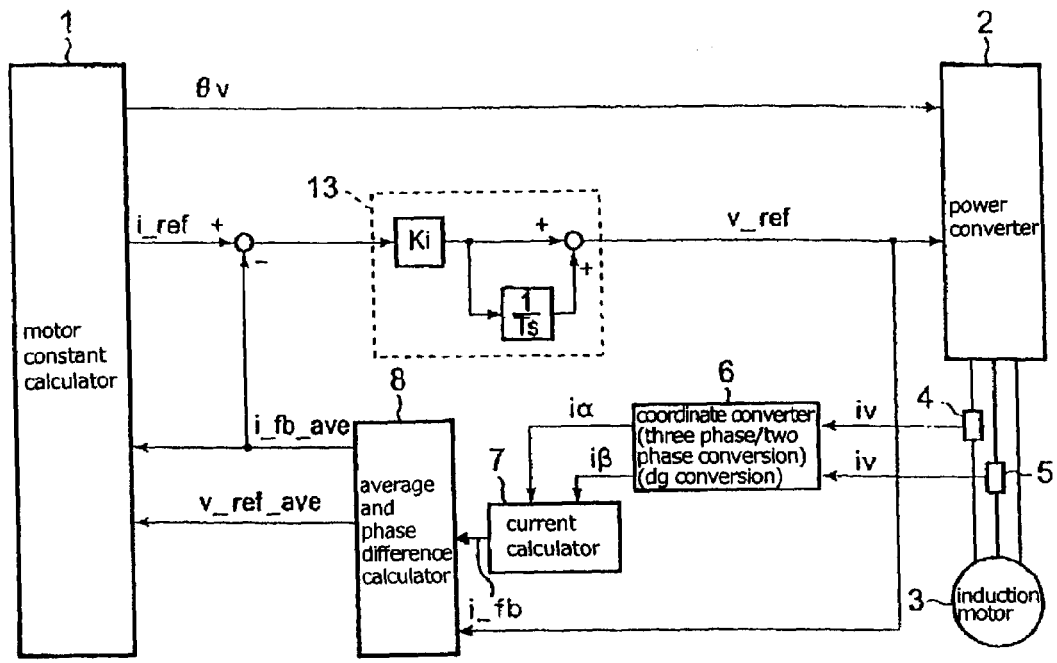
FIG. 11 is a block diagram when eleventh to thirteenth and seventeenth embodiments are applied.

FIG. 11 is a block diagram illustrating the configuration of a motor control apparatus which implements the method of measuring a motor constant for an induction motor in the eleventh to thirteenth embodiments. Motor constant calculator 1 delivers current command i_ref. The values of currents flowing into induction motor 3 are captured as current iu detected by current detector 4 for U-phase and current iv detected by current detector 5 for v-phase. Three-phase/two-phase converter 6 performs calculations expressed by Equations (1) and (2) to convert iu and iv to two-phase AC currents iα and iβ.

$$iw = -(iu+iw) \qquad (1)$$

$$\begin{bmatrix} i\alpha \\ i\beta \end{bmatrix} = \frac{2}{3}\begin{bmatrix} 1 & -\frac{1}{2} & -\frac{1}{2} \\ 0 & -\frac{\sqrt{3}}{2} & -\frac{\sqrt{3}}{2} \end{bmatrix}\begin{bmatrix} iu \\ iv \\ iw \end{bmatrix} \qquad (2)$$

The phases at which currents are detected are not limited to a combination of U-phase and v-phase, but the current may be detected at two arbitrary phases or at all the three phases.

Current calculator 7 calculates a square root of the sum of squared two-phase AC currents iα, iβ to find detected current value i_fb. i_fb is fed to average and phase difference calculator 8 to calculate average i_fb_ave. While the average is herein calculated by taking the absolute value of i_fb and passing the result through a low pass filter, another method such as moving average may be used to calculate the average. Current Proportional-plus-integration controller 13 performs a control such that current command i_ref matches average detected current value i_fb_ave. The output of current Proportional-plus-integration controller 13 is voltage command v_ref. Power converter 2 converts voltage command value v_ref into a line-to-line voltage, calculates the output phase of a three-phase AC current using voltage phase θv applied from motor constant calculator 1, and supplies induction motor 3 with three-phase AC power.

An eleventh embodiment will be described.

Figure 12:
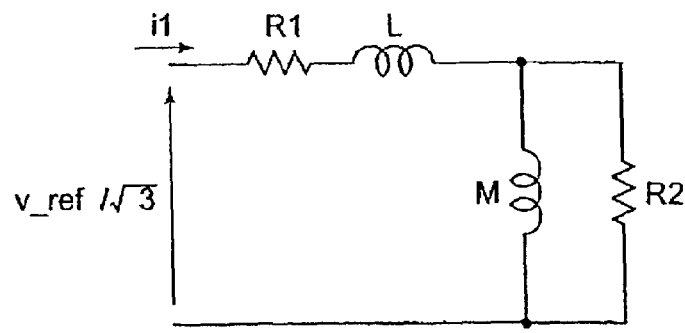
FIG. 12 is a T-1 type equivalent circuit diagram of an induction motor.
Figure 13:
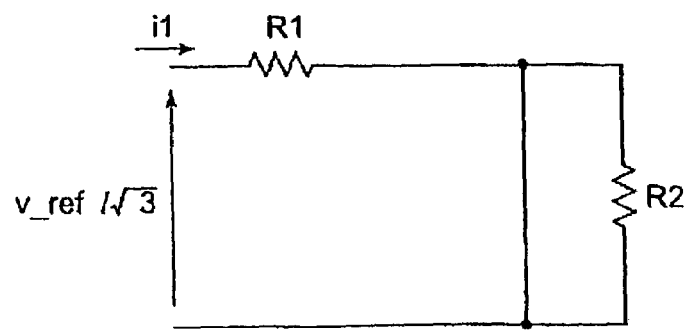
FIG. 13 is an equivalent circuit diagram when a DC current is fed to the induction motor.

FIG. 12 illustrates a T-1 type equivalent circuit for one phase of an induction motor. R1 represents a primary resistance; L a leakage inductance; M a mutual inductance; R2 a secondary resistance; and s a slippage. When a DC current is fed, an impedance component of mutual inductance M is zero, so that the equivalent circuit is changed as illustrated in FIG. 13.

The following description will be made on the assumption that the phase is at 0° when a current at U-phase reaches a peak.

In this embodiment, voltage phase θv is at 0°.

Figure 14:
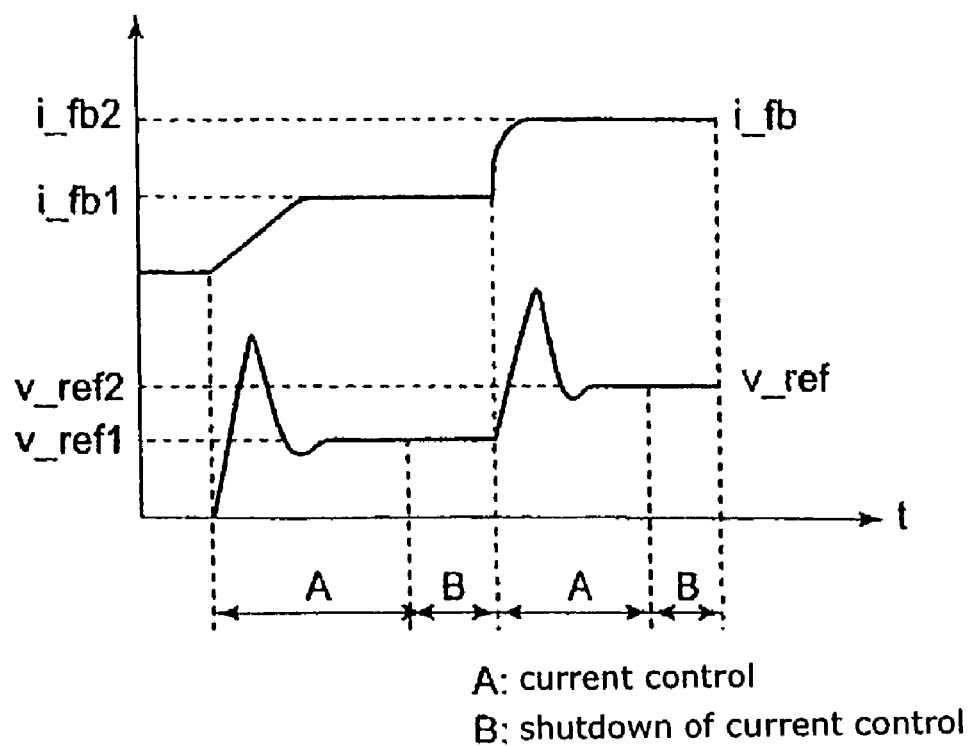
FIG. 14 is a time chart of a voltage command value and a detected current value during primary resistance tuning.
Figure 15:
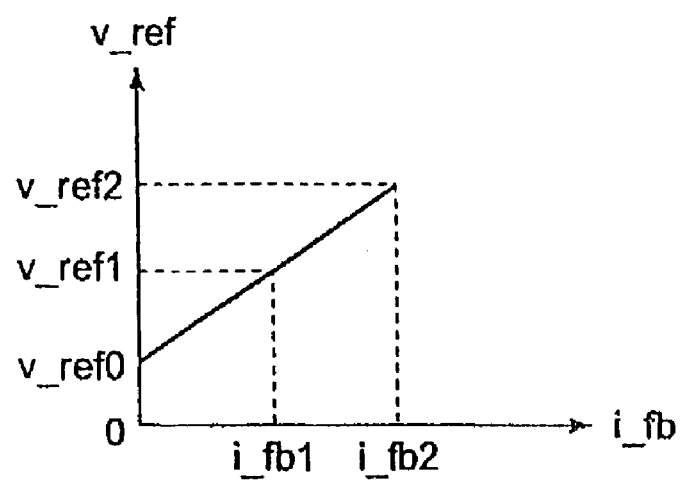
FIG. 15 is a graph of the voltage command value and detected current value during the primary resistance tuning.

First, when a value equal to 20% of the rated current of the induction motor is applied as current command value i_ref, voltage command v_ref is changed as shown in FIG. 14 by the action of current Proportional-plus-integration controller 13. At the time detected current value i_fb_ave matches i_ref1, v-ref becomes constant. Here, the width of section A for controlling the current over time is determined by waiting for two seconds. Since the time until the stability is ensured is related to control characteristics, a wait for two seconds is generally sufficient. However, if the gain of current Proportional-plus-integration controller 13 cannot be increased due to the characteristics of a load machine or the like, this time should be extended. After the lapse of two seconds, gain Ki of current Proportional-plus-integration controller 13 is set to zero, and the value saved in the integrator is delivered as v_ref, thereby fixing current command value v_ref. After waiting a certain time (here, one second), v_ref_ave which is an average of v_ref, and i_fb_ave which is an average of i_fb are read, and set to v_ref1, i_fb1, respectively, v_ref_ave is calculated by feeding the value of v_ref to average and phase difference calculator 8. Next, 40% of the rated current of the induction motor is applied as current command i_ref, and a similar control is conducted. Then, voltage command value v_ref_ave and detected current value i_fb_ave are read, and set to v_ref2, i_fb2, respectively. The data at two points are plotted as shown in FIG. 15. Since this slope represents primary resistance value R1, R1 is calculated in accordance with:

$$R1=\{(v\_ref2-v\_ref1)/\sqrt{3}\}/(i\_fb2-i\_fb1)$$

Then, 2×R1 is set to line-to-line resistance value RL-L. While the current value is set herein to 20% and 40% of the rated current of the induction motor, different values may be used, or the foregoing operation may be performed at three points or more of the current value.

In the twelfth embodiment, measurements at three points or more are made. When the measurements are made, for example, at three points of current values 20%, 40%, 60%, the slopes are calculated respectively between 20% and 40%, between 40% and 60% and between 20% and 60%. The slopes may be averaged for use.

A thirteenth embodiment will be described. As shown in FIG. 15, the previously measured data is approximated by a linear function and extended for recording the value of v_ref when the current value is zero, as voltage offset value v_ref0. This corresponds to a voltage drop caused by devices used for power converter 2 and the like. When the measurements are made at three points or more of the current value, the voltage offset value may be found by linear approximation of two arbitrary points or a regression curve based on a mean square error method.

Figure 16:
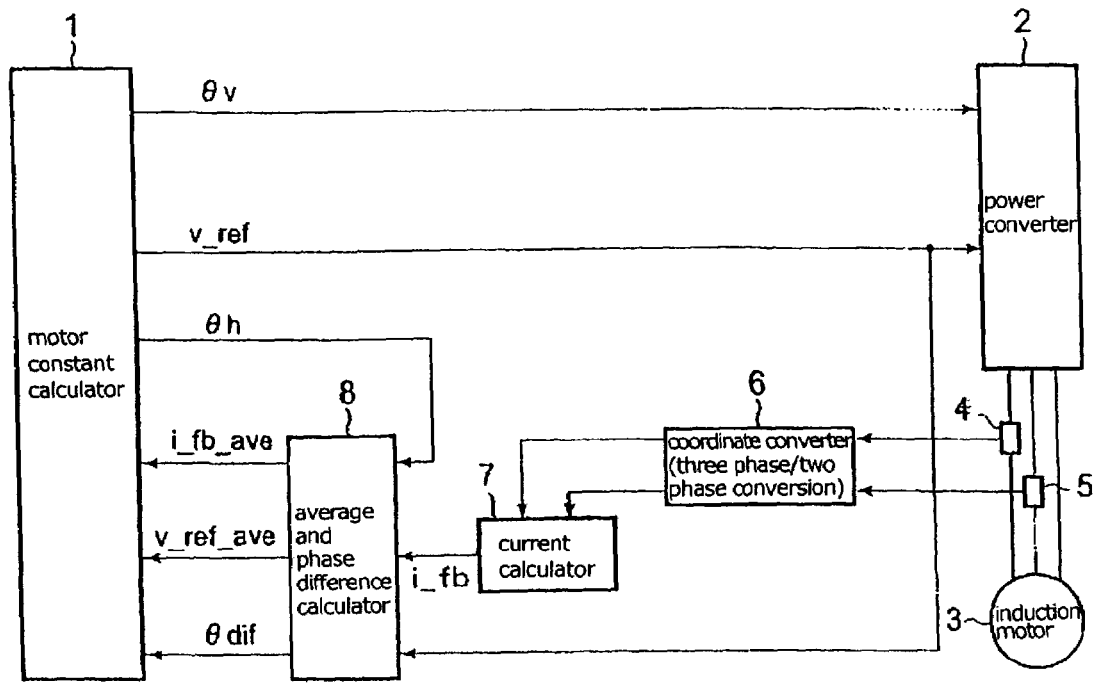
FIG. 16 is a block diagram when a fourteenth and a fifteenth embodiment are applied.
Figure 17:
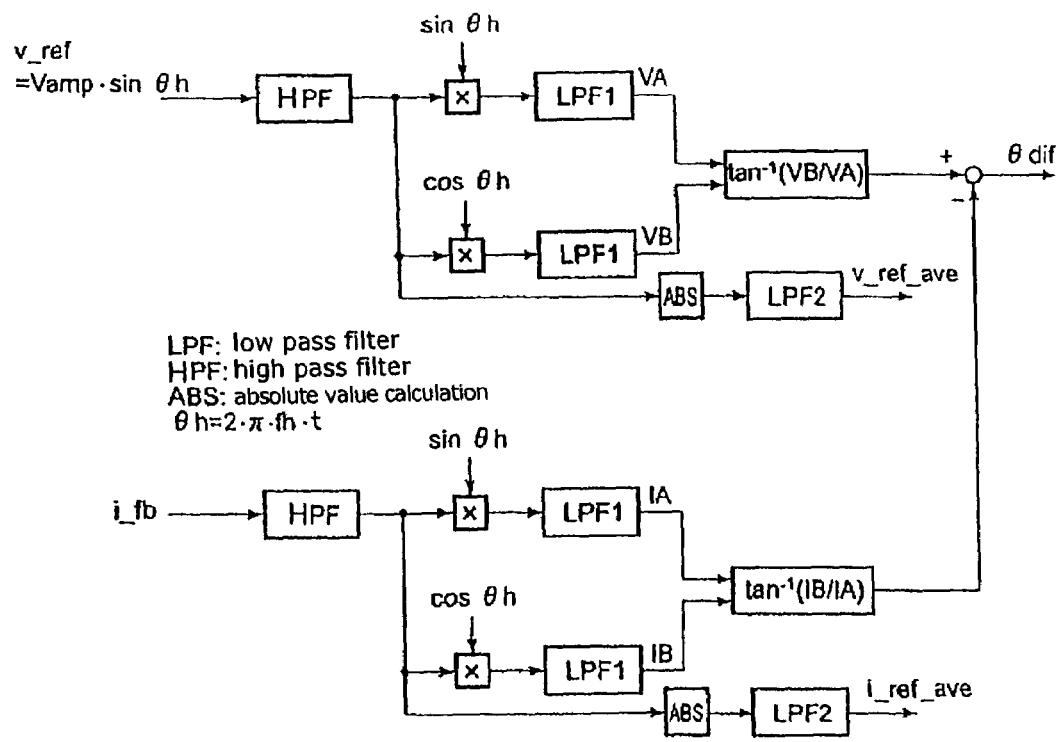
FIG. 17 is a configuration diagram of average/phase difference calculator 8.

A fourteenth embodiment will be described. FIGS. 16 and 17 are block diagrams for implementing methods of a fourteenth embodiment and a fifteenth embodiment.

In FIG. 15, output voltage command v_ref and output voltage phase θv are applied from motor constant calculator 1 to power converter 2 to supply a three-phase AC current based thereon for operating induction motor 3. The value of the current flowing into induction motor 3 is captured as current iu detected by current detector 4 for U-phase and current iv detected by current detector 5 for v-phase. Coordinate converter 6 performs the calculations expressed by Equations (1) and (2) to convert iu and iv to two-phase AC currents iα and iβ. The phases at which the currents are detected are not limited to a combination of U-phase and v-phase, but the current may be detected at two arbitrary phases or at all the three phases.

Current calculator 7 calculates a square root of the sum of squared two-phase AC currents iα, iβ to find detected current value i_fb. Voltage command v_ref, detected current value i_fb, and phase θh at which an instantaneous value of the amplitude is given for v_ref applied by motor constant calculator 1, are fed to average and phase difference processor 8 which calculates v_ref_ave which is an average of v_ref, i_fb_ave which is an average of i_fb, and phase difference θdif which are fed to motor constant calculator 1 for calculating a motor constant. Differences of FIG. 15 from FIG. 11 are that voltage command v_ref is applied instead of the current command, and average and phase difference calculating circuit 8 is applied with phase θh of a frequency component which is given as voltage command v_ref. FIG. 17 is a block diagram illustrating the configuration of average and phase difference calculator 6. Average and phase difference processor 6 calculates v_ref, i_fb_ave which is an average of i_ref, and phase difference θdif based on the processing in the block diagram of FIG. 17.

Figure 18:
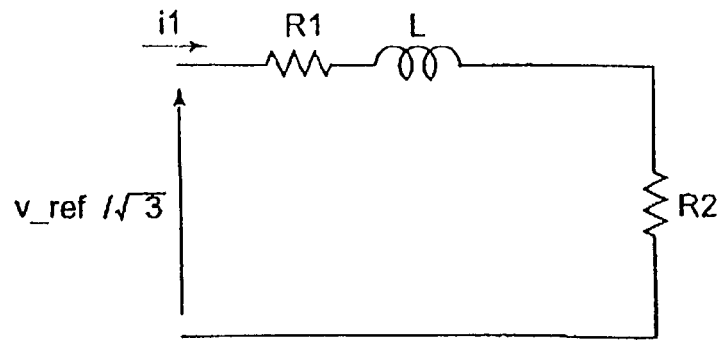
FIG. 18 is an equivalent circuit during secondary resistance and leakage inductance tuning.

The equivalent circuit of the induction motor illustrated in FIG. 12 can be approximated to a series circuit of R1, L, R2 as illustrated in FIG. 18 because impedance ωM by mutual inductance M becomes larger as compared with R2 at higher frequencies. Therefore, resistance component R1+R2 and reactance component ωL are determined from the magnitudes of the voltage and current, and the phase difference between them.

Figure 19:
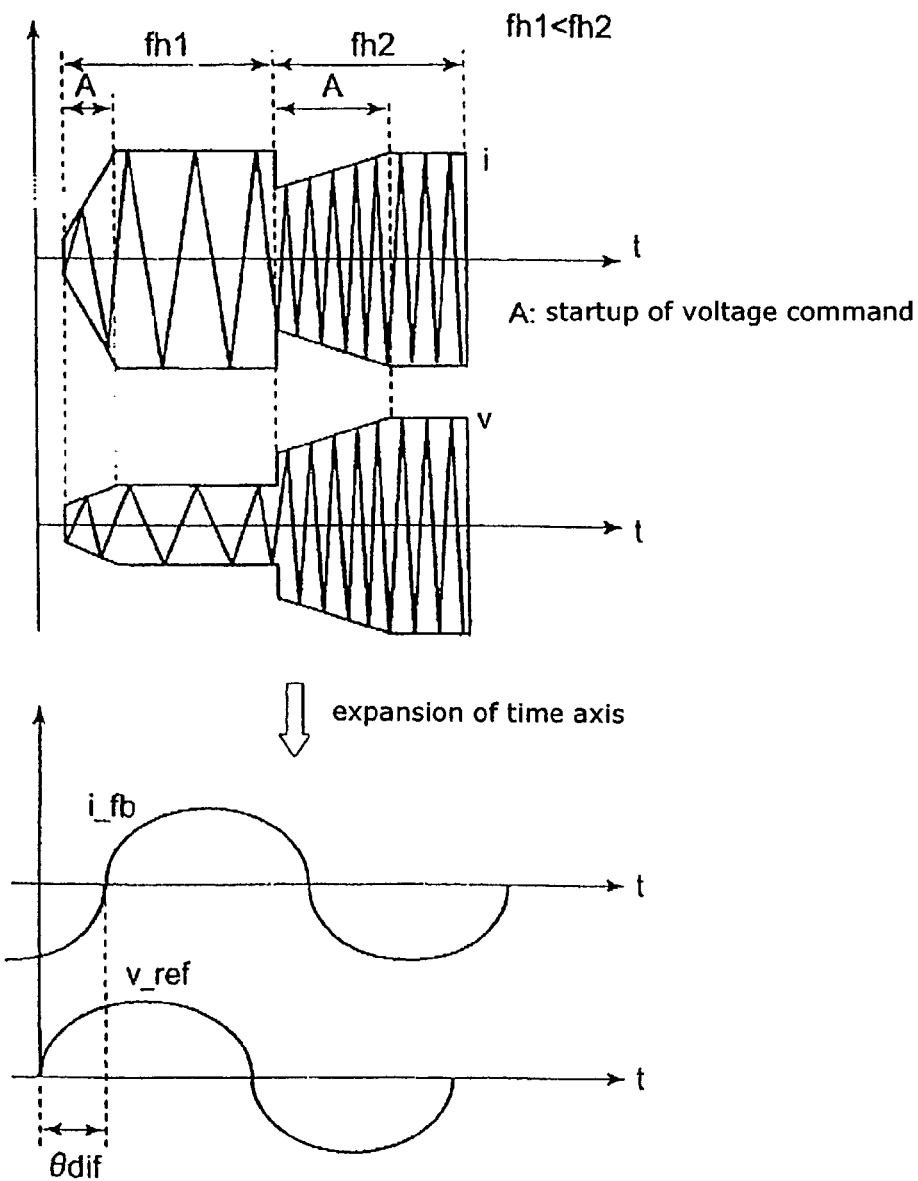
FIG. 19 is a time chart of a voltage command value and a detected current value during the secondary resistance and leakage inductance tuning.
Figure 20:
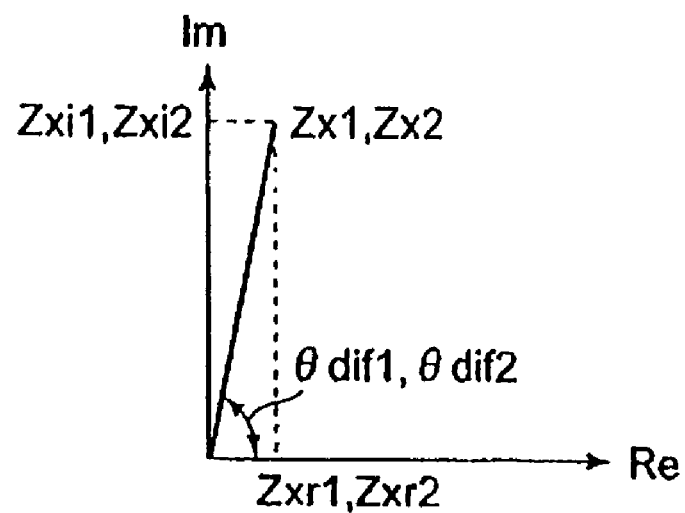
FIG. 20 is a vector diagram of an impedance in the equivalent circuit during the secondary resistance and leakage inductance tuning.

In this embodiment, θv is set to 0°; first frequency fh1 to 15 Hz; second frequency fh2 to 30 Hz; and the set current value described in the fourteenth embodiment to 80% of the rated current of the induction motor. First, the induction motor is operated with the magnitude of the voltage amplitude Vamp set to zero, and the magnitude of the voltage command given by v_ref=vamp·sin(2·π·15·t), where t is time. Voltage amplitude Vamp is adjusted while i_fb is monitored such that average detected current value i_fb reaches 80% of the rated current of the induction motor. Vamp should be adjusted by an appropriate step which does not cause the current to suddenly change. In this embodiment, a step equal to 1/1000 of the rated voltage of the induction motor was added to or subtracted from Vamp. After average detected current value i_fb reaches 80% of the rated current of the induction motor, an average of the absolute value of magnitude v_ref of the voltage command is set to v_ref_ave1; an average of the absolute value of the magnitude of detected current value i_fb to i_fb_ave1; and the phase of i_fb with respect to v_ref to θdif1 after the lapse of an arbitrarily set time (here three seconds). Next, the frequency is set to 30 Hz at which a similar operation is performed to that at 15 Hz. In this event, an average of the absolute value of magnitude v_ref of the voltage command is set to v_ref_ave2; an average of the absolute value of the magnitude of detected current value i_fb to i_fb_ave2; and the phase of i_fb with respect to v_ref to θdif2. Here, respective saturated values are fed to low pass filters, the outputs of which are used for the averages. A time chart of the voltage command and detected current value at this time is shown in FIG. 19. When the relationship between the voltage, current and phase difference established herein is handled in complex numbers as shown in FIG. 20, the impedance, and its real component and imaginary component are given by the following equations:

$$Zx1=(v\_ref\_ave1/\sqrt{3})/(i\_fb\_ave1), Zx2=(v\_ref\_ave2/\sqrt{3})/(i\_fb\_ave2)$$

Figure 21:
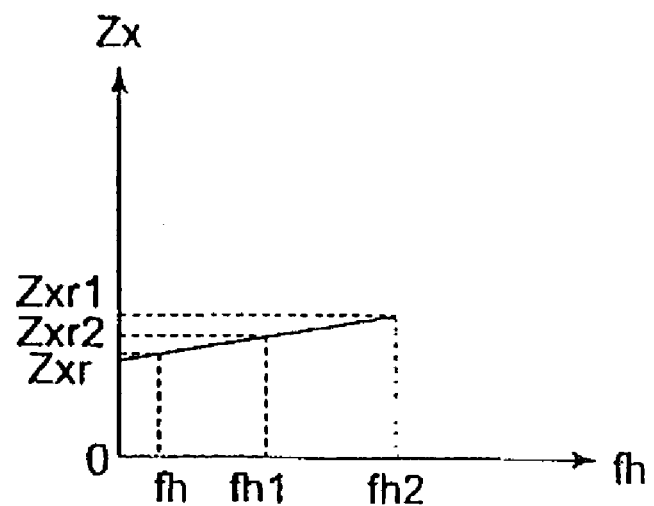
FIG. 21 is a diagram showing a change due to the frequency of a real component of the impedance in the equivalent circuit during the secondary resistance and leakage inductance tuning.

$Zxr1=Zx1 \cdot \cos \theta\text{dif}\_1$, $Zxr2=Zx2 \cdot \cos \theta\text{dif}\_2$, $Zxi1=Zx1 \cdot \sin \theta\text{dif}\_1$, $Zxi2=Zx2 \cdot \sin \theta\text{dif}\_2$, In this event, real components Zxr1, Zxr2 represent resistance component R1+R2, while imaginary components Zxi1, Zxi2 represent reactance component ωL. First, consider the real components. Zxr1 at fh1 (15 Hz) and Zxr2 at fh2 (30 Hz) are graphically represented as shown in FIG. 21, and change together with the frequency. This is presumably due to the influence of a skin effect and the like. R2 is calculated in accordance with R2=Zxr−R1, whereas R1 is measured by feeding a DC current, so that a value when frequency fh is at 10 Hz (fh=fh1·fh2/(fh1+fh2)=15·30/(15+30)) is as Zxr through linear approximation of measured values as shown in FIG. 21. Next, consider the imaginary components. Since the imaginary components are substantially proportional to the frequency component, the leakage inductance is calculated in accordance with L=Zxi/(2·π·fh_1) using the values at fh2 (30 Hz), where Zxi=Zxi2 and fh_1=fh2. Here, fh2 is used because the voltage value becomes larger at a higher frequency, resulting in a reduction in measurement error. The lower frequency may be used, or the leakage inductance may be calculated from the slope at two frequencies.

Next, a fifteenth embodiment will be described. In the measurement of the secondary resistance and leakage inductance, the previously determined voltage offset value v_ref0 is used to calculate Zx1 and Zx2 by the following equations:

$Zx1=(v\_\text{ref}\_\text{ave}1/\sqrt{3}-v\_\text{ref}0)/(i\_fb\_\text{ave}1)$, $Zx2=(v\_\text{ref}\_\text{ave}2/\sqrt{3}-v\_\text{ref}0)/(i\_fb\_\text{ave}2)$ The subsequent calculations are similar to the foregoing.

Figure 22A:
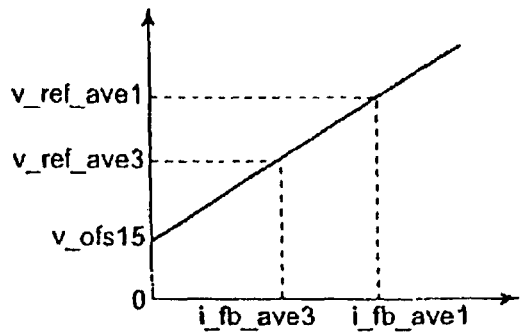
FIG. 22(a) is a diagram showing the relationship between a current and a voltage value when signals at 15 Hz is applied.
Figure 22B:
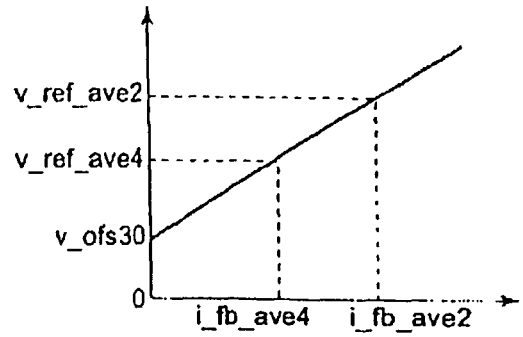
FIG. 22(b) is a diagram showing the relationship between a current and a voltage value when signals at 30 Hz is applied.

In the fourteenth embodiment, similar measurements are made at the same frequency as the foregoing and with application of current i_fb2 different in magnitude from the current value fed during the measurement. Here, as an example, i_fb2 is set to 40% of the rated current of the motor (one half of the foregoing), and an average of the absolute value of the voltage command value at 15 Hz is set to v_ref_ave3; an average of the absolute value of the detected current value at 15 Hz to i_fb_ave3; and an average of the voltage command value at 30 Hz to v_ref_ave4; and an average of the absolute value of the detected current value at 30 Hz to i_fb_ave4. As shown in FIGS. 22(a), 22(b), linear approximation is made with two current values at 15 Hz, 30 Hz, respectively, and the values at the current value equal to zero are derived as voltage offset v_ofs15 at 15 Hz and voltage offset v_ofs30 at 30 Hz. In another method, these offset values may be used for the voltage command values at 15 Hz, 30 Hz instead of voltage offset value v_ref0 in the thirteenth embodiment to compensate for the voltage offset. Alternatively, rather than deriving the voltage offset values, the impedances may be calculated at 15 Hz, 30 Hz, respectively, from the slope when the current value is changed. Also, an average value of two current values may be used for the phase to calculate a real part and an imaginary part of the impedance.

Though description has been omitted in the foregoing processing for simplification, the voltage values and current values when the signals at 15 Hz, 30 Hz are applied are passed through low pass filters for averaging, after their absolute values are taken, and therefore they are averages. On the other hand, voltage value offset value v_ref0 described in a thirteenth embodiment is derived from a DC value and therefore is an effective value or a maximum value, so that v_ref0 is converted to an average which is used. While the average is used herein, any of the effective value, average, maximum value may be used as long as the conversion associated therewith is consistent.

Figure 23:
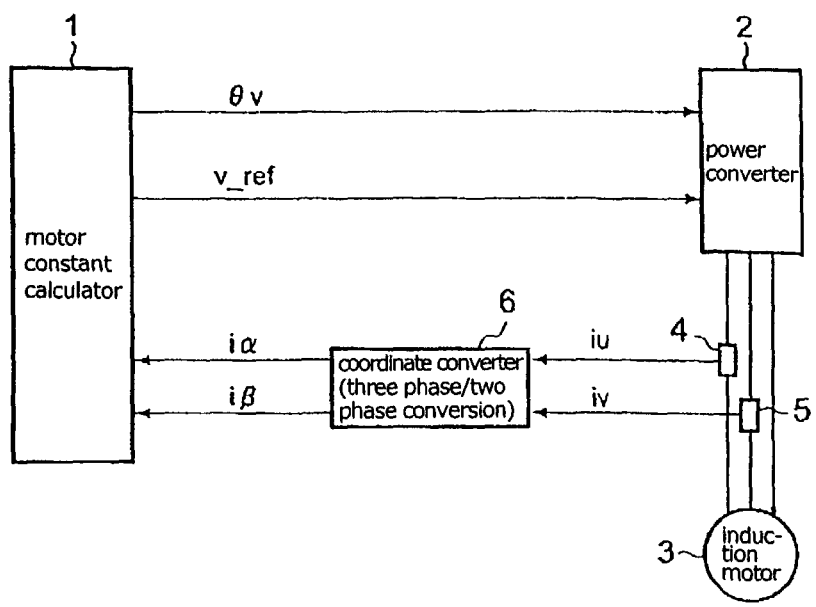
FIG. 23 is a block diagram when a sixteenth to a nineteenth embodiment are applied.

FIG. 23 is a block diagram illustrating the configuration of an apparatus for implementing a method of measuring a motor constant for an induction motor in a sixteenth and a seventeenth embodiment of the present invention. In FIG. 23, power converter 2 converts voltage command v_ref and voltage phase θv applied from motor constant calculator 1 to three-phase AC power which is supplied to induction motor 3. The values of currents flowing into induction motor 3 are captured as current iu detected by current detector 4 for U-phase and current iv detected by current detector 5 for v-phase. Coordinate converter 6 performs the calculations expressed by Equations (1) and (2) to convert iu and iv to two-phase AC currents iα and iβ.

In Equation (2), the multiplication by (2/3) is intended for equaling the magnitude of the amplitude before and after the conversion. The phases at which the currents are detected are not limited to a combination of the U-phase and v-phase, but the currents may be detected at arbitrary two phases or at all the three phases. Two-phase AC currents iα and iβ are fed to motor constant calculator 1 which calculates detected primary current value i1 as a square root of the sum of squared two-phase AC currents iα, iβ.

FIG. 23 shows an inverter-based motor driving apparatus from which parts required for practicing the present invention are extracted, wherein blocks such as velocity control, current control and the like disposed prior to voltage command and output voltage phase are replaced by motor constant calculator 1 during a normal operation in a conventional method of identifying a motor constant. Both are switched by an additional switch.

First, description will be made on the principle of a sixteenth embodiment.

Figure 24:
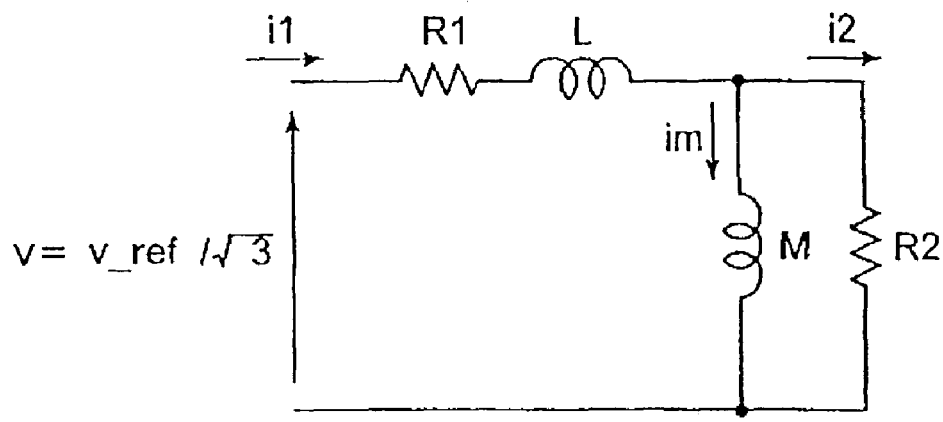
FIG. 24 is a T-1 type equivalent circuit diagram of an induction motor.

FIG. 24 illustrates a T-1 type equivalent circuit per phase in an inoperative induction motor (slippage s=1). R1 represents a primary resistance; L a leakage inductance; R2 a secondary resistance; M a mutual inductance; v an applied voltage; i1 a primary current of the motor; i2 a secondary current of the motor; and im a current (excited current) flowing through mutual inductance M.

When an electromotive force generated by a change in the current flowing through mutual conductance M is represented by em, equations based on Kirchhoff's law are established in the equivalent circuit of FIG. 24 as follows:

$$v = R1 \cdot i1 + L\frac{di1}{dt} + e_m \quad (3)$$

$$e_m = M\frac{dim}{dt} = R2 \cdot i2 \quad (4)$$

$$i1 = im + i2 \quad (5)$$

Since leakage inductance L is smaller than mutual inductance M, Equation (3) is transformed into:

$$v = R1 \cdot i1 + e_m \quad (6)$$

when leakage inductance L is ignored for simplification.

Also, from Equations (4) and (5):

$$i1 = im + \frac{1}{R2} \cdot M \cdot \frac{dim}{dl} \tag{7}$$

Equations (4) and (7) are substituted into Equation (6) for integration:

$$v = R1 \cdot im + \frac{M(R1+R2)}{R2} \cdot \frac{dim}{dl} \tag{8}$$

when Equation (8) is solved for im with an initial condition of:

$$im0=0 \text{ when } t=0 \tag{9}$$

$$im = \frac{v}{R1} \cdot \left(1 - e^{-\frac{1}{\tau}}\right) \tag{10}$$

$$\tau = -\frac{M(R1+R2)}{R1 \cdot R2} \tag{11}$$

where $\tau$ is a time constant.
Thus, $$M = \frac{R1 \cdot R2}{R1+R2} \cdot \tau \tag{12}$$

is established. As time constant $\tau$ is determined from current im flowing through mutual inductance M and substituted into Equation (12), mutual conductance M can be calculated.

Description will be made on the principle of a seventeenth embodiment.

Current im flowing through mutual inductance M is a current which flows within the induction motor, so that it cannot be directly measured from the input terminal of the induction motor. Therefore, description will be next made on a method of estimating current im flowing through mutual inductance M.

From Equations (4) and (6):

$$i2 = \frac{v - R1 \cdot i1}{R2} \tag{13}$$

Substituting Equation (13) into Equation (5):

$$im = i1 - i2 = i1 - \frac{v - R1 \cdot i1}{R2} \tag{14}$$

Rearrangement of Equation (14) results in:

$$im = \left(1 + \frac{R1}{R2}\right) \cdot i1 - \frac{v}{R2} \tag{15}$$

In this way, im can be calculated in accordance with Equation (15) using voltage v applied to the motor, and primary current i1 flowing into the motor. Then, time constant $\tau$ is determined from a change in this im, and substituted into Equation (12), whereby mutual inductance M can be calculated.

No-load current I0 is a current which flows when the induction motor is applied with the power at the rated voltage and rated frequency and rotated without load, in which case an equivalent circuit is represented by a series circuit of R1, L, M in the form of T-1 type equivalent circuit in FIG. 24.

Therefore, the relationship between voltage v and current i1 in this event is expressed by:

$$v = R1 \cdot i1 + j\omega(L+M) \cdot i1 \tag{16}$$

$$\omega = 2\pi f, \text{ where } f \text{ is the frequency of the power} \tag{17}$$

Equation (16) is rewritten only with attention paid to the magnitudes of the voltage and current to derive the rated voltage V:

$$V = \sqrt{R1^2 + \omega^2(L+M)^2} \cdot I0 \tag{18}$$

V, I are values indicative of the magnitudes of the voltage and current, respectively, and may be any of effective values, maximum values or averages as long as the same one is employed for the voltage and current.

When Equation (18) is solved for I0:

$$I0 = \frac{v}{\sqrt{R1^2 + \omega^2(L+M)^2}} \tag{19}$$

no-load current I0 is calculated.

Although R1 and L are taken into consideration in Equations (16), (18), (19), R1 and L may be ignored for simplification.

Figure 25:
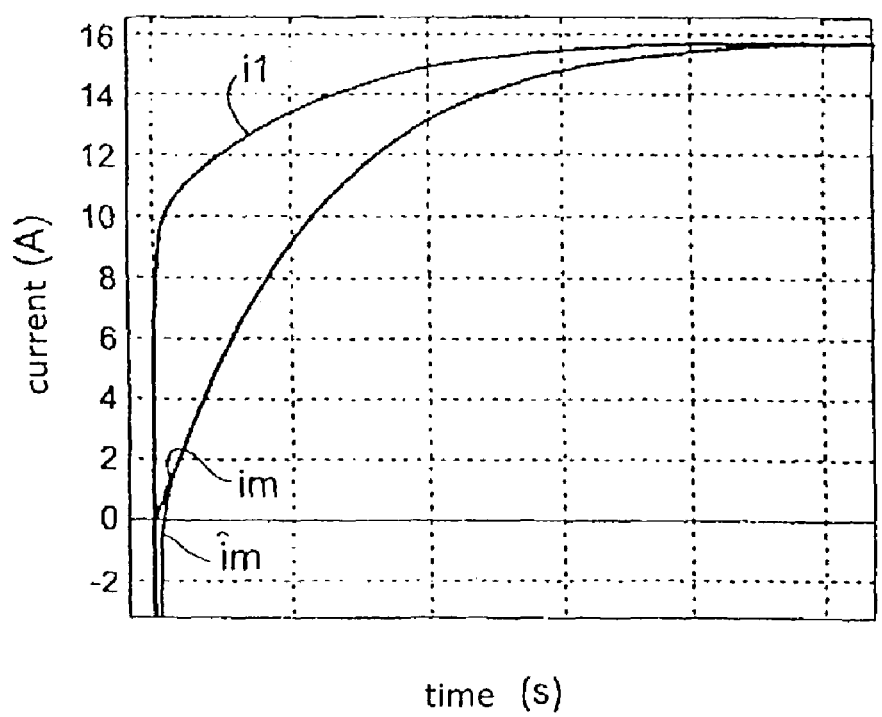
FIG. 25 is a diagram showing a time-varying waveform of a current when the induction motor is applied with a DC voltage.

FIG. 25 shows the waveform of a change over time of estimate îm of im calculated in accordance with Equation (15) using primary current i1 when voltage v equal to V1 is applied stepwise, current im flowing through mutual inductance, primary current i1, and R1, R2. I1$_\infty$ to which i1, im, îm converge is (V1/R1), and the waveform of îm changing from 0 to i1$_\infty$ can be confirmed to substantially match the waveform of im. Therefore, time constant $\tau$m may be determined from a change in îm at this time.

Now, contents of a method implemented on the basis of the foregoing principle will be described with reference to FIG. 23.

The following description will be made on the assumption that the current at the U-phase reaches a peak at phase of 0°.

In this embodiment, voltage phase θv was set at 0° for implementation.

First, description will be made on a method of determining the magnitude of predetermined voltage V1 applied to motor 3. While voltage V1 applied to motor 3 may be at an arbitrary value, voltage V1 must actually be limited within a range in which induction motor 3 is not damaged by heat generated by the current. Therefore, description on the method of determining V1 will be made herein in an example in which voltage V1 is applied such that a resulting current value reaches 50% of the rated current of the motor. First, voltage command v_ref at zero is applied, and v_ref is increased in increments of ¹⁄₁₀₀₀ of the rated voltage of the induction motor while detected current value i1 is measured. Then, at the time detected current value i1 reaches 50% of the rated current of the induction motor, the value of v_ref at this time is stored as V1, and the power supplied to motor 3 is shut off. The increment for the voltage command may be arbitrarily set at such a magnitude that does not cause a sudden change in the current. When a current controller is provided, 50% of the rated current is applied as the current command. Then, at the time the detected current value matches the current command value, the current command value at this time may be set to V1. When the primary resistance is measured with a DC current applied therefor before identification of the mutual inductance or no-load current described in the present invention, a current value and a voltage command value at that time may be used. Of course, the current value may be set at a value other than 50% of the rated current.

Next, V1 is applied as voltage command v_ref, and induction motor 3 is applied with a voltage stepwise. Primary current i1 is measured at this time, and îm is calculated in accordance with the aforementioned Equation (15). Here, in Equation (15), v corresponds to v_ref, and im to îm. Values used for R1, R2 are given by a test result table of the induction motor or another existent identifying means.

Time constant τ is determined from the waveform of rising îm, and the value at this time is designated by $\hat{\tau}_{im}$. $\hat{\tau}$m is substituted into τ shown in Equation (12) to calculate mutual inductance M. While time constant $\hat{\tau}$m is generally determined by measuring a time for îm to reach from zero to a final (convergence) value (1−1/e)≈0.632, measurements may be made on a change in the current at an arbitrary current value and on a time during the change, and conversion may be made to match this time with the time constant. In the latter case, measurements can be made at a plurality of points, thereby making it possible to reduce variations by measuring several data and averaging the data.

A seventeenth embodiment will be described.

Since rated voltage Vrate and rated frequency frate of the induction motor are given in the specifications of the induction motor, no-load current I0 is calculated by substituting rated voltage Vrate and rated frequency frate, R1, L, R2 given by the test result table of the induction motor or another existent identifying means, and M identified by the aforementioned method into Equation (19):

$$I0 = \frac{Vrate}{\sqrt{R1^2 + (2\pi frate)^2(L+M)^2}} \qquad (20)$$

When an error is tolerable to some degree, L and R1 may be omitted in the calculation for simplification.

Next, an eighteenth embodiment will be described.

As discussed above, when a DC current is applied, the equivalent circuit of the induction motor can be regarded as having only the primary resistance. Therefore, although the DC current transiently flows into the secondary resistance immediately after the DC current is applied, the primary resistance alone exists when a sufficient time has elapsed, so that the voltage is given by:

$$v = R1 \cdot i1_\infty$$

where i1∞îm $\hat{\tau}_{im}$ represents a current value to which primary current value i1 converges. The aforementioned Equation (15) can be rewritten to:

$$im = i1 - \frac{R1}{R2}(i1_\infty - i1) \qquad (21)$$

Here, because of an estimate, im is described as îm. Subsequently, a calculation is made in a manner similar to the aforementioned sixteenth embodiment. In doing so, since no-voltage value is used in the calculation, the measurement can be made independently of a voltage accuracy of the driving apparatus. When a value upon measurement of the primary resistance is used in applying the voltage command as described above, the value used for i1∞ may be a current value which is read upon measurement of the resistance.

A nineteenth embodiment carries out the seventeenth embodiment using the method of calculating îm in the eighteenth embodiment.

The invention claimed is:

1. A method of measuring a motor constant for an induction motor in a motor vector control apparatus having a d-axis current proportional-plus-integral controller which receives a current command for a d-axis component of a primary current of the induction motor and a detected current value of the d-axis component for controlling a deviation between said current command for the d-axis component and said detected current value of the d-axis component to reduce to zero; a first adder for adding an output of said d-axis current proportional-plus-integral controller and an arbitrary d-axis auxiliary voltage command value to derive a d-axis voltage command value; a q-axis current proportional-plus-integral controller which receives a current command for a q-axis component of the primary current of the induction motor and a detected current value of the q-axis component for controlling a deviation between said current command for the q-axis component and said detected current value of the q-axis component to reduce to zero; a second adder for adding an output of said q-axis current proportional-plus-integral controller and an arbitrary q-axis auxiliary voltage command value to derive a q-axis voltage command value; and a power converter for calculating a magnitude v_ref and a voltage phase θv of a voltage command from the d-axis voltage command value and the q-axis voltage command value, and converting a DC current to a three-phase AC current based on the magnitude v_ref of said voltage command and the voltage phase θv of said voltage command to output the three-phase AC current, said motor vector control apparatus being configured to convert the induction motor to an equivalent circuit of a three-phase Y (star) connection for handling and controlling the induction motor, said method comprising the steps of:

applying a d-axis current command value id_ref1 and a q-axis current command value iq_ref1 previously set at arbitrary fixed values as first command values, and applying the arbitrary d-axis auxiliary voltage command value vd_ref_c and the arbitrary q-axis auxiliary voltage command value vq_ref_c both set at zero to operate said vector control apparatus;

after the lapse of a previously set first time, setting a proportional gain of the d-axis current proportional-plus-integral controller and a proportional gain of the q-axis current proportional-plus-integral controller to zero, and after the lapse of a previously set second time from this time, creating the voltage command:

$$v\_ref = \sqrt{(vd\_ref^2 + vq\_ref^2)}$$

from the d-axis voltage command vd_ref and the q-axis voltage command vq_ref, and creating the detected current value:

$$i\_fb = \sqrt{(id\_fb^2 + iq\_fb^2)}$$

from the d-axis detected current value id_fb and the q-axis detected current value iq_fb;

setting an average of v_ref and an average of i_fb recorded within an arbitrary time during the second time as first data v_ref1, i_fb1, respectively;

returning the gains of both said proportional-plus-integral controllers to original values, applying a d-axis current command value id_ref2 and a q-axis current command value iq_ref2 previously set at arbitrary fixed values as second command values, and applying the arbitrary d-axis auxiliary voltage command value vd_ref_c and the arbitrary q-axis auxiliary voltage command value vq_ref_c set at zero to operate said vector control apparatus;

after the lapse of the previously set first time, setting the proportional gain of the d-axis current proportional-plus-integral controller and the proportional gain of the q-axis current proportional-plus-integral controller to zero, and after the lapse of the previously set second time from this time, calculating a primary resistance of the induction motor in accordance with:

$$R1 = \{(v\_ref2 - v\_ref1)/\sqrt{3}\}/(i\_fb2 - i\_fb1)$$

using an average of v_ref and an average of i_fb stored within an arbitrary time during the second time as second data v_ref2, i_fb2, respectively, and calculating a line-to-line resistance value of the induction motor in accordance with $R_{L-L} = 2 \cdot R1$.

2. The method according to claim 1, including, after the lapse of the first time:

setting the output of the d-axis current proportional-plus-integral controller to the arbitrary d-axis auxiliary voltage command value, and simultaneously setting the proportional gain and integral gain of the d-axis current proportional-plus-integral controller and the output of the d-axis current proportional-plus-integral controller to zero; and setting the output of the q-axis current proportional-plus-integral controller to the arbitrary q-axis auxiliary voltage command value, and simultaneously setting the proportional gain and integral gain of the q-axis current proportional-plus-integral controller and the output of the q-axis current proportional-plus-integral controller to zero.

3. The method according to claim 1, wherein three or more levels are provided for the d-axis current command value and the q-axis current command value previously set at arbitrary fixed values, and the primary resistance is calculated as an average of the values of the primary resistance calculated in respective intervals.

4. A method of measuring a motor constant for an induction motor in a motor vector control apparatus having a d-axis current proportional-plus-integral controller which receives a current command for a d-axis component of a primary current of the induction motor and a detected current value of the d-axis component for controlling a deviation between said current command for the d-axis component and said detected current value of the d-axis component to reduce to zero; a first adder for adding an output of said d-axis current proportional-plus-integral controller and an arbitrary d-axis auxiliary voltage command value to derive a d-axis voltage command value; a q-axis current proportional-plus-integral controller which receives a current command for a q-axis component of the primary current of the induction motor and a detected current value of the q-axis component for controlling a deviation between said current command for the q-axis component and said detected current value of the q-axis component to reduce to zero; a second adder for adding an output of said q-axis current proportional-plus-integral controller and an arbitrary q-axis auxiliary voltage command value to derive a q-axis voltage command value; and a power converter for calculating a magnitude v_ref and a voltage phase θv of a voltage command from the d-axis voltage command value and the q-axis voltage command value, and converting a DC current to a three-phase AC current based on the magnitude v_ref of said voltage command and the voltage phase θv of said voltage command to output the three-phase AC current, said vector control apparatus being configured to convert the induction motor to an equivalent circuit of a three-phase Y (star) connection for handling and controlling the induction motor, said method comprising the steps of:

setting gains and outputs of both said proportional-plus-integral controllers, the arbitrary d-axis auxiliary voltage command value and the arbitrary q-axis auxiliary voltage command value to zero, setting the voltage phase θv to a previously set arbitrary fixed value, and giving a magnitude vref of the voltage command by v_ref=vamp·sin(2·π·fh·t), where fh is a frequency 1/10 or more as high as a rated operation frequency of the induction motor, and vamp is a voltage amplitude;

incrementally or decrementally adjusting vamp while monitoring a current value i_fb such that:

$$i\_fb = \sqrt{(id\_fb^2 + iq\_fb^2)}$$

calculated from a d-axis detected current value id_fb and a q-axis detected current value iq_fb reaches a previously arbitrarily set first set current value;

after i_fb reaches said first set current value, setting an average of an absolute value of the magnitude v_ref of the voltage command to v_ref_ave1, an average of an absolute value of the magnitude of the detected current value i_fb to i_fb_ave1, and the phase of i_fb with respect to v_ref to θdif1 after the lapse of an arbitrarily set time;

adjusting vamp to reach a previously set second set current value, and setting the average of the absolute value of the magnitude v_ref of the voltage command to v_ref_ave2, the average of the absolute value of the magnitude of the detected current value i_fb to i_fb_ave2, and the phase of i_fb with respect to v_ref to θdif2 after the lapse of said set time;

calculating:

$$Zx = \{v\_ref\_ave2 - V\_ref\_ave1\}/\sqrt{3}\}/(i\_fb\_ave2 - i\_fb\_ave1), \theta dif\_L = (\theta dif1 + \theta dif2)/2,$$

$$Zx\_r = Zx \cdot \cos \theta dif\_L, Zx\_i = Zx \cdot \sin \theta dif\_L, \text{ and}$$

from this, calculating a secondary resistance of the induction motor in accordance with $R2 = Zx\_r - R1$, and a leakage inductance in accordance with $L = Zx\_i/(2 \cdot \pi \cdot fh)$.

5. The method according to claim 4, including adding a DC offset component v_ref_ofs to the voltage command value to apply the voltage command expressed by v_ref=vamp·sin(2·π·fh·t)+v_ref_ofs, feeding the detected current value i_fb to a high pass filter designed to filter out a DC component and pass a signal having an fh component therethrough to use an output of the high pass filter as new i_fb, feeding v_ref to a high pass filter having the same characteristics as that used for i_fb, and calculating the secondary resistance R2 and the leakage inductance L of the induction motor in accordance with the three equations of Zx, θdif_L, and Zx_r using the output of the high pass filter as new v_ref.

6. The method according to claim 5, including calculating the primary resistance:

$$R1=\{(v\_ref\_dc2-v\_ref\_dc2)/ \sqrt{3}\}/(i\_fb\_dc2-i\_fb\_dc1)$$

using an average v_ref_dc1 of the voltage command v_ref and an average i_fb_dc1 of the detected current value i_fb at the first set current value before the detected current value i_fb is fed to the high pass filter, and an average v_ref_dc2 of the voltage command v_ref and an average i_fb_dc2 of the detected current value i_fb at the second set current value before the detected current value i_fb is fed to the high pass filter, and calculating the secondary resistance R2 using the first resistance value.

7. A method of measuring a motor constant for an induction motor in a motor vector control apparatus having a d-axis current proportional-plus-integral controller which receives a current command for a d-axis component of a primary current of the induction motor and a detected current value of the d-axis component for controlling a deviation between said current command for the d-axis component and said detected current value of the d-axis component to reduce to zero; a first adder for adding an output of said d-axis current proportional-plus-integral controller and an arbitrary d-axis auxiliary voltage command value to derive a d-axis voltage command value; a q-axis current proportional-plus-integral controller which receives a current command for a q-axis component of the primary current of the induction motor and a detected current value of the q-axis component for controlling a deviation between said current command for the q-axis component and said detected current value of the q-axis component to reduce to zero; a second adder for adding an output of said q-axis current proportional-plus-integral controller and an arbitrary q-axis auxiliary voltage command value to derive a q-axis voltage command value; and a power converter for calculating a magnitude v_ref and a voltage phase θv of a voltage command from the d-axis voltage command value and the q-axis voltage command value, and converting a DC current to a three-phase AC current based on the magnitude v_ref of said voltage command and the voltage phase θv of said voltage command to output the three-phase AC current, said vector control apparatus being configured to convert the induction motor to an equivalent circuit of a three-phase Y (star) connection for handling and controlling the induction motor, said method comprising the steps of:

setting gains and outputs of both said proportional-plus-integral controllers, the arbitrary d-axis auxiliary voltage command value and the arbitrary q-axis auxiliary voltage command value to zero, setting a voltage phase θv to a previously set arbitrary fixed value, and giving a magnitude vref of the voltage command by v_ref=vamp·sin(2·π·f1·t), where f1 is a frequency ⅕ or less as high as a rated operation frequency of the induction motor, and vamp, is a voltage amplitude;

incrementally or decrementally adjusting vamp while monitoring a current value i_fb such that:

$$i\_fb=\sqrt{(id\_fb^2+iq\_fb^2)}$$

calculated from a d-axis detected current value id_fb and a q-axis detected current value iq_fb reaches a previously arbitrarily set first set current value;

after i_fb reaches said first set current value, setting an average of an absolute value of the magnitude v_ref of the voltage command to v_ref_ave3, an average of an absolute value of the magnitude of the detected current value i_fb to i_fb_ave3, and the phase of i_fb with respect to v_ref to θdif3 after the lapse of a first arbitrary set time;

adjusting vamp to reach a previously set second set current value, and setting the average of the absolute value of the magnitude v_ref of the current command to v_ref_ave4, the average of the absolute value of the magnitude of the detected current value i_fb to i_fb_ave4, and the phase of i_fb with respect to v_ref to θdif4 after the lapse of said first set time;

calculating:

$$Zx2=\{v\_ref\_ave4-v\_ref\_ave3)/ \sqrt{3}\}/(i\_fb\_ave4-i\_fb\_ave3),\ \theta dif\_m=(\theta dif3+\theta dif4)/2,$$

$$Zx\_r2=Zx\cdot\cos\theta dif\_m,\ and$$

from this, calculating a mutual inductance of the induction motor in accordance with the following equation:

$$M = \frac{R2}{2\cdot\pi\cdot f1} \cdot \sqrt{\frac{Zx\_r2 - R1}{R1 + R2 - Zx\_r2}}.$$

8. The method according to claim 7, including adding a DC offset component v_ref_ofs to the voltage command value to apply the voltage command expressed by v_ref=vamp·sin(2·π·f1·t)+v_ref_ofs, feeding the detected current value i_fb to a high pass filter designed to filter out a DC component and pass a signal having an fh component therethrough to use an output of the high pass filter as new i_fb, feeding v_ref to a high pass filter having the same characteristics as that used for i_fb, and calculating the mutual inductance M of the induction motor in accordance with said calculation equation using the output of the high pass filter as new v_ref.

9. The method according to claim 8, including calculating the primary resistance:

$$R1=\{(v\_ref\_dc2-v\_ref\_dc2)/ \sqrt{3}\}/(i\_fb\_dc2-i\_fb\_dc1)$$

using an average v_ref_dc1 of the voltage command v_ref and an average i_fb_dc1 of the detected current value i_fb at the first set current value before the detected current value i_fb is fed to the high pass filter, and an average v_ref_dc2 of the voltage command v_ref and an average i_fb_dc2 of the detected current value i_fb at the second set current value before the detected current value i_fb is fed to the high pass filter, and calculating the secondary resistance R2 using the first resistance value.

* * * * *

UNITED STATES PATENT AND TRADEMARK OFFICE
CERTIFICATE OF CORRECTION

PATENT NO.        : 7,039,542 B2                                              Page 1 of 1
APPLICATION NO.   : 10/341091
DATED             : May 2, 2006
INVENTOR(S)       : Shuichi Fujii, et al.

It is certified that error appears in the above-identified patent and that said Letters Patent is hereby corrected as shown below:

On the title page: Item [73] Assignee to read as follows:
--Kabushiki Kaisha Yaskawa Denki, Fukuoka, Japan--

Signed and Sealed this

Third Day of October, 2006

JON W. DUDAS
*Director of the United States Patent and Trademark Office*